United States Patent
Yasuda

Patent Number: 5,996,044
Date of Patent: *Nov. 30, 1999

[54] SAMPLING FREQUENCY CONVERTING DEVICE AND MEMORY ADDRESS CONTROL DEVICE

[75] Inventor: Nobuyuki Yasuda, Chiba, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/677,974

[22] Filed: Jul. 10, 1996

Related U.S. Application Data

[62] Division of application No. 08/377,115, Jan. 23, 1995, Pat. No. 5,617,088.

[30] Foreign Application Priority Data

| Jan. 26, 1994 | [JP] | Japan | P06-007124 |
| Jan. 28, 1994 | [JP] | Japan | P06-008366 |
| Jan. 28, 1994 | [JP] | Japan | P6-008367 |

[51] Int. Cl.⁶ .......................... G06F 12/02; G11B 20/10; H03M 7/00
[52] U.S. Cl. .............................................. 711/110; 341/61
[58] Field of Search .............................. 341/61; 395/849, 395/880, 200.63; 370/545; 711/110, 200; 708/313; 710/29, 60; 709/233

[56] References Cited

U.S. PATENT DOCUMENTS

| 4,953,117 | 8/1990 | Lagadec | 364/724.1 |
| 5,119,093 | 6/1992 | Vogt et al. | 341/61 |
| 5,131,042 | 7/1992 | Oda | 84/605 |
| 5,132,970 | 7/1992 | Urbansky | 370/545 |
| 5,345,468 | 9/1994 | Kakubo et al. | 364/724.1 |
| 5,365,468 | 11/1994 | Kakubo et al. | 364/724.1 |
| 5,398,029 | 3/1995 | Toyama et al. | 341/61 |
| 5,613,084 | 3/1997 | Hau et al. | 341/61 |
| 5,765,187 | 6/1998 | Shimizu et al. | 711/110 |

Primary Examiner—Eddie P. Chan
Assistant Examiner—Yamir Encarnación
Attorney, Agent, or Firm—Jay H. Maioli

[57] ABSTRACT

A sampling frequency converting device. A memory unit stores an input signal $D_{si}$ having an input sampling frequency Fsi. An interpolation unit interpolates the readout signal from the storage unit. A sampling frequency ratio detection unit detects the current sampling frequency ratio $R_n$ between the input sampling frequency Fsi and the output sampling frequency $F_{so}$ and detects a new sampling frequency ratio $R_{n\ NEW}$ based on the current sampling frequency ratio $R_n$ and a past detected value $R_{n-1}$ preceding the current detected value by one detection period. A control unit having the sampling frequency detection unit controls the storage unit and the interpolating unit from the new sampling frequency ratio $R_{n\ NEW}$. Since the present sampling frequency converting device is not susceptible to accumulation of re-sampling time address errors even if the sampling frequency ratio continues to be changed for a pre-set time duration, the capacity of the storage unit is not increased, while there is no necessity of restricting the speed or amount of change in the sampling frequency ratio.

5 Claims, 18 Drawing Sheets ns with a sampling frequency of $F_{so}$.
These re-sampling time addresses are generated in dependence upon the ratio of the sampling frequency of input signals (input sampling frequency) $F_{si}$ to the sampling frequency of re-sampled signals (output sampling frequency) $F_{so}$.

In general, the present sampling frequency converting device employs the re-sampling time addresses for specifying the re-sampling points for re-sampling the input signal having the sampling frequency $F_{si}$. The re-sampling time addresses are generated depending on the ratio of the sampling frequency of the input signal (input sampling frequency) $F_{si}$ and the sampling frequency of re-sampled signals (output sampling frequency) $F_{so}$.

Specifically, the period t (=N·$T_{so}$) equal to N times the period of the output sampling frequency $F_{so}$ (output sampling frequency) is counted with input reference clocks equal to M times the input sampling frequency $F_{si}$ (input master clocks) or $MCK_i$ (=M·$F_{si}$) to find the sampling frequency ratio R between the input sampling frequency $F_{si}$ and the output sampling frequency $F_{so}$, at the same time as jitter components such as $F_{si}$, $MCK_i$ or $F_{so}$ are removed on averaging. The sampling frequency ratio R and the re-sampling time are cumulatively added together to generate the re-sampling time address. The re-sampling points stored in the re-sampling buffer memory are read out in accordance with the re-sampling time addresses for converting the sampling frequency.

Meanwhile, for such applications in which the input sampling frequency $F_{si}$ or the output sampling frequency $F_{so}$ are changed, there arises the inconvenience that an error tends to be transiently produced between the value of the sampling frequency ratio R and the actual ratio of $F_{si}/F_{so}$.

Consequently, high-precision conversion is realized under a condition of the constant input sampling frequency $F_{si}$ or the constant output sampling frequency $F_{so}$.

In addition, if the sampling frequency ratio continues to be changed for a predetermined time, the re-sampling time address errors tend to accumulate under the effect of the temporal difference ΔR of the sampling frequency ratio shown in FIG. 1, such that the buffer memory capacity is exceeded, thus leading to limitations imposed on the speed and amount of change of the sampling frequency ratio or to increased buffer memory capacity.

Alternatively, it may be felt that the re-sampling time address resolution may be improved by increasing the frequency of the input master clocks $MCK_i$ without the necessity of increasing the detection period t. However, in such case, the problem of limitations imposed on the operating speed of the circuit counters absorption and removal of input clock jitter. Thus it has not been possible to prevent errors from accumulating by simply increasing the frequency of the input master clocks $MCK_i$ for improving the re-sampling time address resolution, although the errors may thereby be reduced.

In addition, if, for performing frequency conversion with the above-described sampling frequency converting device, the power source is turned on, signal input/output is changed over, the noise is mixed or the input/output sampling frequency is rendered variable, the data write address for writing data in the re-sampling buffer memory or the data readout address for reading out data from the buffer memory approach or cross over each other, thus producing a non-continuous noise from the sampling frequency converting device.

For stabilizing the sampling frequency converting operation, it is necessary to initialize the memory readout

SAMPLING FREQUENCY CONVERTING DEVICE AND MEMORY ADDRESS CONTROL DEVICE

This is a division of application Ser. No. 08/377,115 filed Jan. 23, 1995, now U.S. Pat. No. 5,617,088 issued Apr. 1, 1997.

BACKGROUND OF THE INVENTION

This invention relates to a sampling frequency converting device for converting the sampling frequency of input signals into an arbitrary sampling frequency by re-sampling, and a memory address control device for controlling the address used when reading out data from a memory unit.

Recently, digital audio signal reproducing devices for transmitting audio signals over an optical cable or a coaxial cable as digital signals and reproducing the digital audio signals via a digital audio interface have become popular. With such digital audio signal reproducing devices, a phase locked loop (PLL) made up of a phase comparator and a voltage controlled oscillator (VCO) is employed for generating clocks from received digital audio signals. However, with such digital audio signal reproducing device, digital/analog (D/A) conversion characteristics tend to be lowered due to jitter introduced by the VCO in the PLL. Consequently, with a device for reproducing a digital audio signal recording medium, such as a compact disc (CD) player or a digital audio tape (DAT) player, there are occasions wherein satisfactory distortion-free audio signals may be produced by converting the digital audio signals into analog audio signals by D/A conversion using quartz clocks and the resulting analog audio signals are subsequently transmitted.

On the other hand, with a recording medium acting as a source for digital audio signals, such as CD, an optical disc smaller in size than CD, DAT or a digital audio tape smaller in size than DAT, the sampling frequency during recording of digital audio signals is not unified and may be any one of 44.1 kHz, 48 kHz or 32 kHz. With satellite broadcast (BS) which is not a recording medium but acts as a source for digital audio signals, the sampling frequency may be any one of the above-given sampling frequencies. Consequently, for recording the digital audio signals from DAT or BS with the sampling frequency of 44.1 kHz on a small-sized optical disc with the sampling frequency of 44.1 kHz, the digital audio signals from DAT or BS with the sampling frequency of 48 kHz need to be converted into analog signals by D/A conversion and subsequently re-converted into digital audio signals with the sampling frequency of 44.1 kHz by analog/digital (A/D) conversion, thus inevitably producing deterioration in characteristics due to distortion.

On the other hand, in mixing-recording digital audio signals using a DAT, respective digital audio signals to be mixed need to be converted into analog signals before proceeding to mixing if the different digital audio signals differ in the sampling frequency or in synchronization methods.

For preventing deterioration in playback digital audio signals due to-deterioration in performance due to clock jitter or difference in sampling frequencies for realizing free sampling frequency conversion, it has been desired to develop a non-synchronization type sampling frequency conversion device.

In general, such sampling frequency converting device exploits re-sampling time addresses for specifying re-sampling points for re-sampling a signal entered at a addresses so that the absolute value of the difference between the write address and the readout address of the re-sampling buffer memory reaches its maximum value after stabilization of the operation of sampling frequency ratio detection for detecting the sampling frequency ratio. However, the initialization of the memory readout addresses is an operation difficult to achieve and signal interruption or noise tend to occur during the converting operation.

OBJECTS AND SUMMARY OF THE INVENTION

It is an object of the present invention to provide a sampling frequency converting device which resolves the above problems.

It is another object of the present invention to provide a sampling frequency converting device which is capable of eliminating the initializing operation during power on, signal input/output changeover, noise or variable input/output sampling frequency, and also capable of preventing signal interruption or noise during the converting operation.

In one aspect, the present invention provides a device for converting the sampling frequency of an input signal into an arbitrary sampling frequency, comprising storage means for storing the input signal, interpolation means for interpolating the signal read out from said storage means, and control means for generating a first sampling frequency ratio between the sampling frequency of the input signal and the arbitrary sampling frequency and a second sampling frequency ratio between the sampling frequency of the input signal and the arbitrary sampling frequency based on the first sampling ratio for suppressing jitter components and for performing sampling frequency conversion. The control means generates a control signal for controlling the address signal of the storage means and the interpolation factors of the interpolation means and for effecting sampling frequency conversion by controlling the storage means and the interpolation means based on the generated address signal and the control signal.

In another aspect, the present invention provides a device for converting the sampling frequency of an input signal into an arbitrary sampling frequency, comprising storage means for storing the input signal, interpolation means for interpolating the signal read out from the storage means, sampling frequency ratio detection means for detecting the sampling frequency ratio between the sampling frequency of the input signal and the arbitrary sampling frequency over a short time period and over a long time period, and control means for controlling the storage means and the interpolation means responsive to the sampling frequency ratio over the short time period and the sampling frequency ratio over the long time period from the sampling frequency ratio detection means.

In a further aspect, the present invention provides a device for converting the sampling frequency of an input signal into an arbitrary sampling frequency, comprising storage means for storing the input signal, interpolation means for interpolating the signal read out from the storage means, sampling frequency ratio detection means for detecting the sampling frequency ratio between the sampling frequency of the input signal and the arbitrary sampling frequency and for detecting a new sampling frequency ratio based on the detected value and a past detected value, and control means for controlling the storage means and the interpolation means based on the new sampling frequency ratio from the sampling frequency ratio detection means.

In a further aspect, the present invention provides a device for converting the sampling frequency of an input signal into an arbitrary sampling frequency, comprising storage means for storing the input signal with the difference between the write address and the readout address being changed arbitrarily, interpolation means for interpolating the signal read out from said storage means, and memory address control means for controlling the readout addresses from the storage means responsive to the sampling frequency ratio between the sampling frequency of the input signal and the arbitrary sampling frequency.

In yet another aspect, the present invention provides a memory address control device for a ring buffer memory for recording and reproducing data, with the difference of the readout address being arbitrarily changed with respect to the write address. The memory access control device comprises address difference detection means for detecting the difference between the write address and the readout address of the ring buffer memory, and readout address optimization control means for optimally controlling the readout address for controlling the address difference detected by the address difference detection means.

DETAILED DESCRIPTION OF PREFERRED EMBODIMENTS

Figure 1:
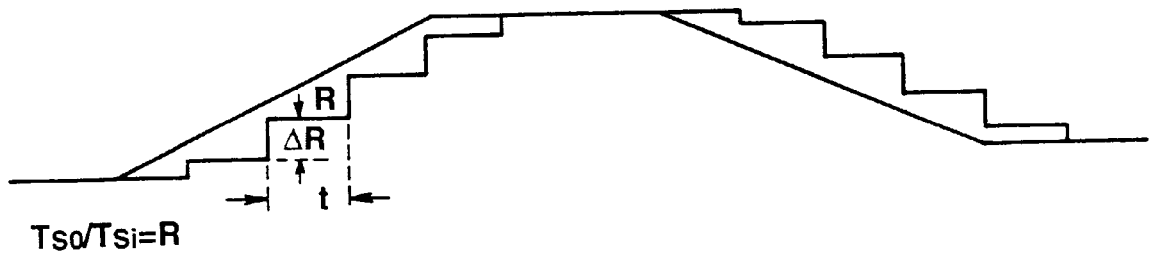
FIG. 1 illustrates the operation of a sampling frequency ratio detection circuit employed in a conventional sampling frequency converting device.

Referring to the drawings, preferred embodiments of the sampling frequency converting device and the memory address controller according to the present invention will be explained in detail.

Figure 2:
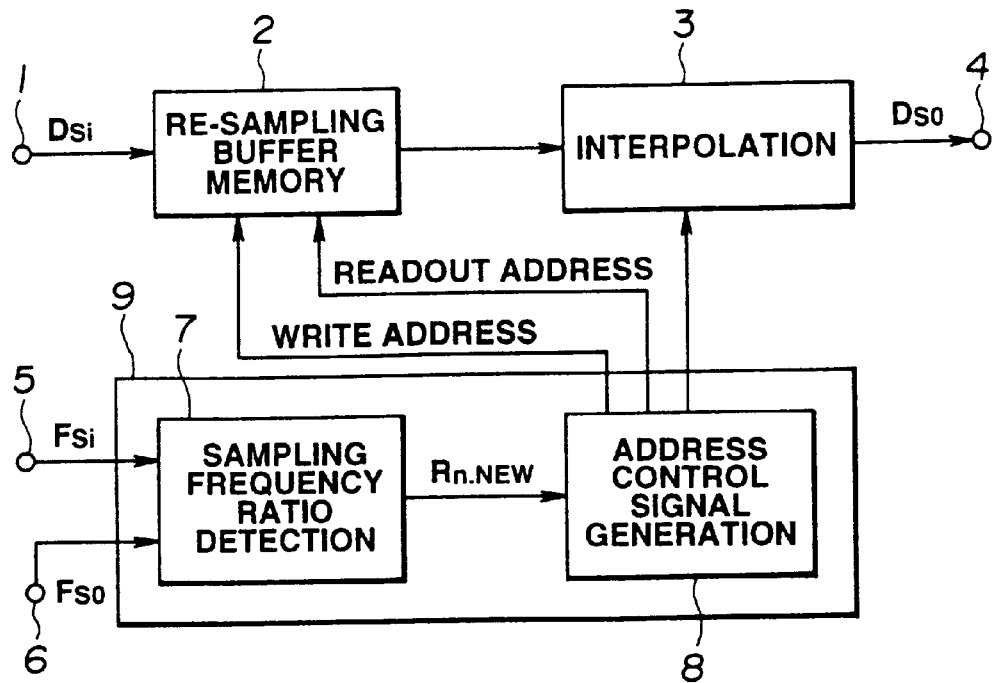
FIG. 2 is a block diagram showing a sampling frequency converting device as a first embodiment of the present invention.

The first embodiment will be explained first of all with reference to FIG. 2.

The present first embodiment is directed to a sampling frequency converting device of converting an input signal $D_{si}$ having a sampling frequency $F_{si}$ at an input terminal 1 into a signal $D_{so}$ having an arbitrary sampling frequency $F_{so}$ by re-sampling, and realizes sampling frequency conversion in which the input system is completely asynchronous with respect to the output system, that is, sampling frequency conversion of a free conversion ratio without the relation of synchroneity between input and output signals. In the following description, the sampling frequency $F_{si}$ of the input signal $D_{si}$ is referred to as the input sampling frequency $F_{si}$, while the arbitrary sampling frequency $F_{so}$ is referred to as the output sampling frequency $F_{so}$.

The present sampling frequency converting device has a re-sampling buffer memory 2 for writing and reading the input signal $D_{si}$ of the input sampling frequency $F_{si}$ entering at the input terminal 1, and an interpolation circuit 3 for interpolating an output signal of the re-sampling buffer memory 2. The sampling frequency converting device also has a control unit 9 for detecting the current sampling frequency ratio $R_n$ from the input sampling frequency $F_{si}$ supplied at an input terminal 5 and the output sampling frequency $F_{so}$ supplied from the input terminal 6, generating a new sampling frequency ratio $R_{n\ NEW}$ based upon the current detection value $R_n$ and a past detection value $R_{n-1}$ preceding the current value by one detection period, producing a control signal controlling an interpolation factor of the interpolation circuit 3 and the address signal of the re-sampling buffer memory 2 based on the new sampling frequency ratio $R_{n\ NEW}$, and controlling the re-sampling buffer memory 2 and the interpolation circuit 3 based on the generated address signal and the control signal for performing the sampling frequency conversion. The interpolation circuit 3 outputs the signal $D_{so}$ having the output sampling frequency $F_{so}$ at an output terminal 4 under control by the control unit 9.

The control unit 9 has a sampling frequency ratio detection circuit 7, and an address control signal generating circuit 8. The sampling frequency ratio detection circuit 7 detects the current sampling frequency ratio $R_n$ from the input sampling frequency $F_{si}$ and the output sampling frequency $F_{so}$ and generates the new sampling frequency ratio $R_{n\ NEW}$ based on the current detection value $R_n$ and the past detection value $R_{n-1}$ preceding the current value by one detection period. The address control signal generating circuit 8 generates a control signal for controlling an address signal for the re-sampling buffer memory 2 and a control signal controlling the interpolation coefficient of the interpolation circuit 3 based upon the new sampling frequency ratio $R_{n\ NEW}$ detected by the sampling frequency ratio detection circuit 7.

Figure 3:
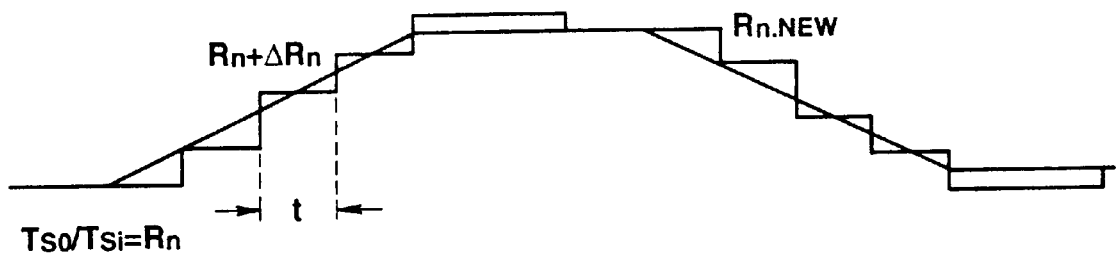
FIG. 3 illustrates the operation of a sampling frequency ratio detection circuit provided in the sampling frequency converting device shown in FIG. 2.

The sampling frequency ratio detection circuit 7 subtracts the past detected value $R_{n-1}$ from twice the current sampling frequency ratio $R_n$ to find a new sampling frequency ratio $R_{n\ NEW}$. This is equivalent to adding a difference $\Delta R_n$ between the current sampling frequency ratio $R_n$ and the past detected value $R_{n-1}$ to the current sampling frequency ratio $R_n$ to find the new sampling frequency ratio $R_{n\ NEW}$ as shown in FIG. 3. That is, the new sampling frequency ratio $R_{n\ NEW}$ is given by the following equation $$R_{n\ NEW}=R_n+\Delta R_n R_n+(R_n-R_{n-1})=2R_n-R_{n-1} \qquad (1)$$

This new sampling frequency ratio $R_{n\ NEW}$ is supplied to the address control signal generating circuit 8.

The address control signal generating circuit 8 is responsive to the new sampling frequency ratio $R_{n\ NEW}$ to generate a re-sampling time address as a data readout address which is supplied to the re-sampling buffer memory 2. The address control signal generating circuit 8 also transmits the data write address to the re-sampling buffer memory 2. The address control signal generating circuit 8 transmits a data write address to the re-sampling buffer memory 2. The address control signal generating circuit is also responsive to the new sampling frequency ratio $R_{n\ NEW}$ to generate an over-sampling factor selection control signal used for over-sampling carried out in the interpolation circuit 3 and leading and trailing linear interpolation factors for linear interpolation (LIP.F.L and LIP.F.T.).

The interpolation circuit 3 is responsive to the re-sampling time addresses to process output data of the re-sampling buffer memory 2 with, for example, FIR filtering to produce two neighboring high-order interpolation data corresponding to the re-sampling time address to generate the signal $D_{so}$ having an output sampling frequency $F_{so}$ by linear interpolation of the two data based on the over-sampling factor selection control signal and the leading and trailing linear interpolation factors for linear interpolation (LIP.F.L and LIP.F.T.).

The sampling frequency converting device thus causes the sampling frequency ratio detection circuit 7 of the control unit 9 to detect the new sampling frequency ratio $R_{n\ NEW}$ and causes the address control signal generating circuit 8 to generate the control signal for controlling the re-sampling time address and the interpolation factors based on the new sampling frequency ratio $R_{n\ NEW}$. Thus it is possible with the present sampling frequency converting circuit to perform sampling frequency conversion by stable interpolation using the interpolation circuit 3 without producing overflow or underflow in the re-sampling buffer memory 2 or increasing the capacity of the re-sampling buffer memory 2.

Figure 4:
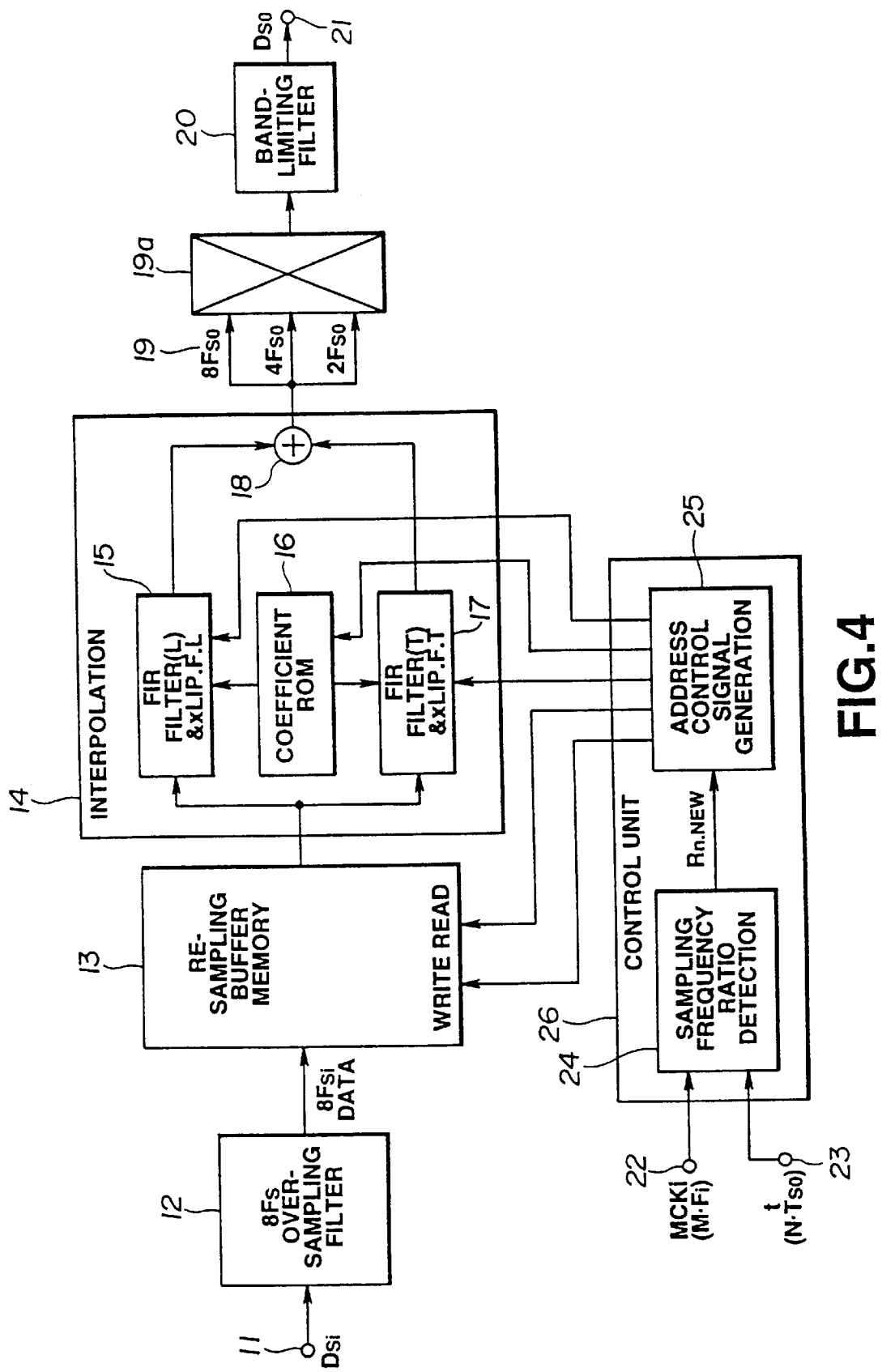
FIG. 4 is a schematic block diagram showing an arrangement of a sampling converting device as a second embodiment of the present invention.
Figure 5:
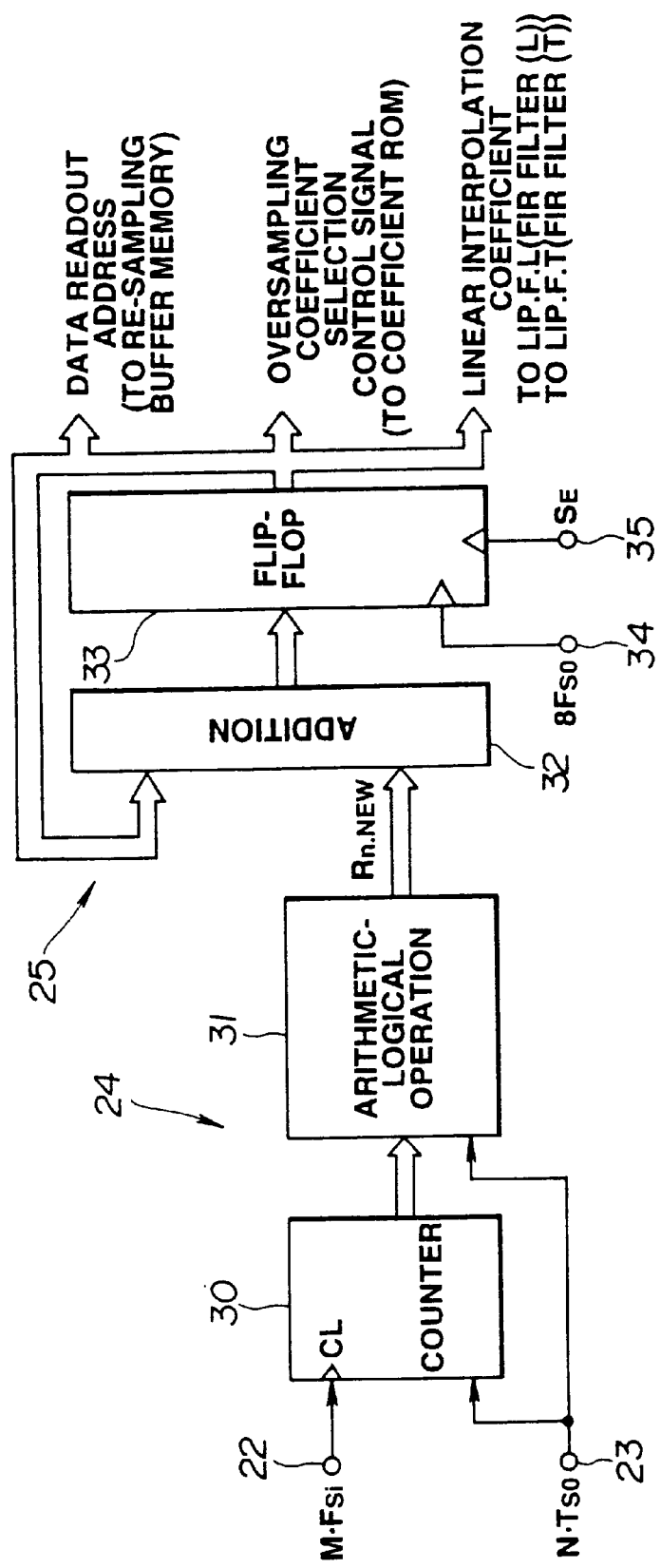
FIG. 5 is a schematic block diagram showing an arrangement of a controller of the sampling converting device shown in FIG. 4.

Referring to FIGS. 4 to 6, a second embodiment of the present invention will be explained.

The second embodiment is directed to a sampling frequency converting device of re-sampling the sampling frequency $F_{si}$ of the input signal $D_{si}$ at an input terminal 11 into the signal $D_{so}$ having an arbitrary sampling frequency $F_{so}$, and realizes sampling frequency conversion in which the input system is completely asynchronous with respect to the output system, that is, sampling frequency conversion at a free conversion ratio without the relation of synchroneity between input and output signals. In the following description, the sampling frequency $F_{si}$ of the input signal $D_{si}$ is referred to as the input sampling frequency $F_{si}$, while the arbitrary sampling frequency $F_{so}$ is referred to as the output sampling frequency $F_{so}$.

Referring to FIG. 4, the present sampling frequency converting device has an $8F_{si}$ over-sampling filter 12 for over-sampling the input signal $D_{si}$ entering at the input terminal 11 into the signal of a frequency $8F_{si}$ and a re-sampling buffer memory 13 for writing and reading the input signal now having the frequency $8F_{si}$ by over-sampling. The sampling frequency converting device also has an interpolation circuit 14 for interpolating an output signal of the re-sampling buffer memory 13, and a control unit 26. The control unit measures the current sampling frequency ratio $R_n$ which is improved in resolution by counting the period t (=$N \cdot T_{so}$) which is N times as large as the period $T_{so}$ of the sampling frequency $F_{so}$ (output sampling period) supplied at an input terminal 23 with input reference clocks (input master clocks) $MCK_i$ (=$M \cdot F_{si}$) supplied at an input terminal 22 at a frequency equal to an integer number times the sampling frequency $F_{si}$ to determine a new sampling frequency ratio $R_{n\ NEW}$ based upon the current sampling frequency ratio $R_n$ and the past detection value $R_{n-1}$ preceding the current value by one detection period. The control unit also generates a control signal controlling the interpolation factors for the interpolation circuit 14 and the address signal for the re-sampling buffer memory 13 responsive to the new sampling frequency ratio $R_{n\ NEW}$ and controls the re-sampling buffer memory 13 and the interpolation circuit 14 based upon the address signal and the control signal to perform the operation of sampling frequency conversion. The sampling frequency converting device also has a re-sampling frequency signal outputting circuit 19 and a band-limiting filter 20. The re-sampling frequency signal outputting circuit 19 sub-samples the sampling frequency of the output signal from the interpolation circuit 14 having the interpolation operation controlled by the control unit 26 to produce an output sampling frequency $F_{so}$ having the frequency values equal to two, four or eight times the sampling frequency and selects one of these frequency values by a multiplexor 19a. The band-limiting filter 20 band-limits the output signal from the re-sampling frequency signal outputting circuit 19 and outputs the output signal $D_{so}$ having the output sampling frequency $F_{so}$ at an output terminal 21.

The digital signal with the sampling frequency of $8F_{si}$, produced by the $8F_{si}$ over-sampling filter 12, enters the re-sampling buffer memory 13, as described above. The re-sampling buffer memory 13 is a 20-bit, 64-word buffer memory, for example, and has the sampling frequency time equal to eight times the input sampling frequency time.

The control unit 26 has a sampling frequency ratio detection circuit 24 and an address control signal generating circuit 25. The sampling frequency ratio detection circuit 24 detects the current sampling frequency ratio $R_n$ improved in resolution by counting the period t (=$N \cdot F_{so}$) supplied from the input terminal 23 at the input master clock $MCK_i$ (=$M \cdot F_{si}$) supplied at the input terminal 22 and determines the new sampling frequency ratio $R_{n\ NEW}$ based on the current sampling frequency ratio $R_n$ and the past detection value $R_{n-1}$ preceding the current value by one detection period. The address control signal generating circuit 25 generates a control signal controlling the interpolation factor of the interpolation circuit 14 and the address signal of the re-sampling buffer memory 13 based on the new sampling frequency ratio $R_{n\ NEW}$.

The sampling frequency ratio detection circuit 24 includes a counter 30 for counting the sampling frequency $N \cdot T_{so}$ of the period entering at the input terminal 23 by the input master clock $MCK_i$, and an arithmetic-logic unit 31 for determining a new sampling frequency ratio $R_{n\ NEW}$ based on the current. sampling frequency ratio $R_n$ which is the count output of the counter 30, as shown in FIG. 5.

The arithmetic-logic unit 31 doubles the current sampling frequency ratio $R_n$ to produce $2R_n$ and subtracts the past sampling frequency ratio $R_{n-1}$ from $2R_n$ to determine the new sampling frequency ratio $R_{n\ NEW}$.

The address control signal generating circuit 25 cumulatively adds the values of the new sampling frequency ratio $R_{n\ NEW}$, output by the arithmetic-logic unit 31, using an addition circuit 32 and a flip-flop circuit 33, to generate a data readout address for the re-sampling buffer memory 13. The address control signal generating circuit is also responsive to the new sampling frequency ratio $R_{n\ NEW}$ to generate an over-sampling factor selection control signal used for over-sampling carried out in the interpolation circuit 14 and leading and trailing linear interpolation factors for linear interpolation (LIP.F.L and LIP.F.T.).

The data readout addresses, over-sampling factor selection control signals and linear interpolation factors are arranged as an upper bit range data, a mid bit range data and a lower bit range data of a data string and are output from the address control signal generating circuit 25.

The flip-flop circuit 33 is preferably a D-flip-flop. 8 $F_{so}$ clocks are supplied from an input terminal 34 in keeping with the sampling frequency 8 $F_{so}$ of the output signals of the second embodiment. If the sampling frequency of the output signals is 4 or $2F_{so}$, 4 or $2F_{so}$ clocks are supplied, while an initializing signal $S_E$ is supplied at an input terminal 35.

Referring to FIG. 4, the interpolation circuit 14 has a leading FIR filter for the leading linear interpolation factor 15 and a trailing FIR filter for the trailing linear interpolation factor 17 for over-sampling data read out by the address control signal generating circuit 25 from the re-sampling buffer memory 13 and processing the data with over-sampling. The interpolation circuit also has a factor ROM 16 for supplying the over-sampling factors to the leading FIR filter for the leading linear interpolation factor 15 and the trailing FIR filter for the trailing linear interpolation factor 17 and an addition circuit 18 for adding an output signal of the leading FIR filter for the leading linear interpolation factor 15 and an output signal of the trailing FIR filter for the trailing linear interpolation factor 17. The factor ROM 16 has, e.g., 32 quantity 24-bit, 7-word over-sampling factors.

Referring to FIG. 6, the operation of the interpolation circuit 14 will now be explained.

Figure 6A:
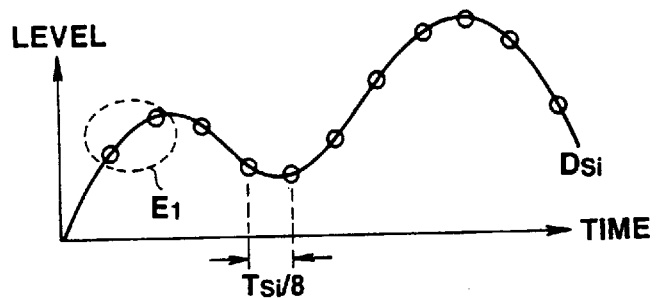
FIGS. 6A–6D illustrate the interpolating operation of the sampling converting device shown in FIG. 4.

The re-sampling buffer memory 13 is responsive to the readout address supplied from the address control signal generating circuit 25 to transmit, e.g., seven data at $T_{si}/8$ to the leading FIR filter for the leading linear interpolation factor 15 and the trailing FIR filter for the trailing linear interpolation factor 17 as shown in FIG. 6A. The leading FIR filter for the leading linear interpolation factor 15 and the trailing FIR filter for the trailing linear interpolation factor 17 convolves, e.g., seven data supplied from there-sampling buffer memory 13 with, e.g., seven factors supplied from the factor ROM 16 to generate 256 $F_{si}$ data.

Figure 6B:
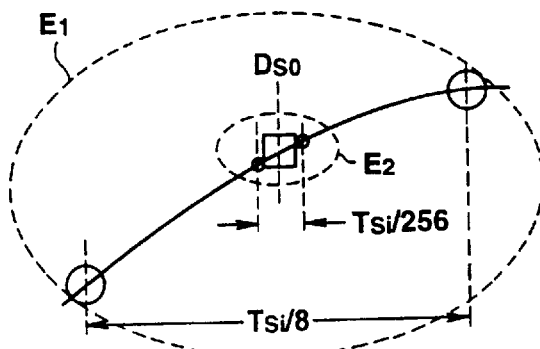

FIG. 6B shows two adjacent data of these 256 $F_{si}$ data. An area $E_1$ enclosed by a broken line in FIGS. 6A and 6B is $T_{si}/8$, while an area $E_2$ enclosed in a broken line in FIG. 6B is two adjacent data of the 256 $F_{si}$ at an interval of $T_{si}/8$.

Figure 6C:
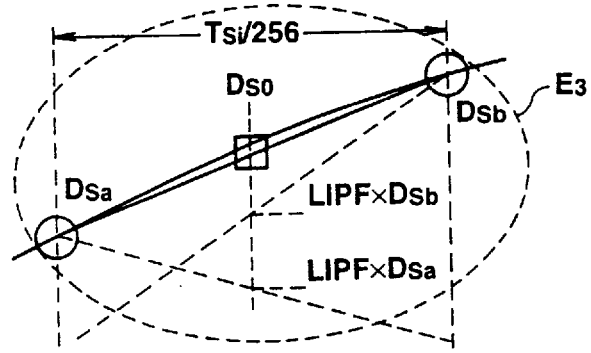

The leading FIR filter for the leading linear interpolation factor 15 and the trailing FIR filter for the trailing linear interpolation factor 17 then multiply the two adjacent data at the interval of $T_{si}/256$ by the linear interpolation factors supplied from the address control signal generating circuit 25. A filter output of the leading FIR filter for the leading linear interpolation factor 15 and a filter output of the trailing FIR filter for the trailing linear interpolation factor 17 are added together at the addition circuit 18. Thus the linear interpolation as shown in FIG. 6C is executed.

Figure 6D:
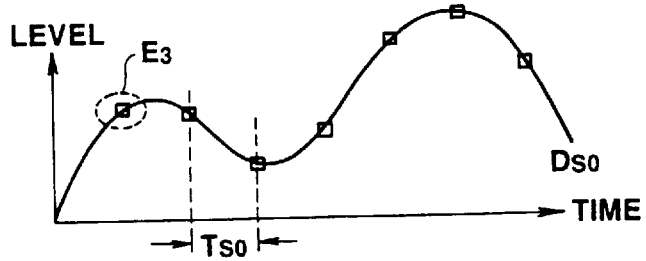

By repeating the over-sampling and the linear interpolation, the present conversion device generates data $D_{so}$ having the sampling frequency $F_{so}$ as shown in FIG. 6D.

The linear interpolation will now be explained.

Among the linear interpolation factors, there are the leading linear interpolation factor LIP.F.L. for the leading FIR filter 15 and the trailing linear interpolation factor LIP.F.T. for the trailing FIR filter 17. These linear interpolation factors are generated using lower-order bits, e.g., 12 bits, of a data string (data value) produced by accumulating the values of the new sampling frequency ratio $R_{n\ NEW}$ by the address control signal generating circuit 25. Specifically, the leading linear interpolation factor is given as 1's complement data of the lower 12 bits, while the trailing linear interpolation factor is given as the lower 12 bits.

In FIG. 6C, there is shown data $D_{so}$ obtained on multiplying the linear interpolation factors with the two data $D_{sa}$, $D_{sb}$ at the interval of $T_{si}/256$.

Output data of the interpolation circuit 14 is 8 $F_{so}$ data. The 8 $F_{so}$ data is routed to a re-sampling frequency signal outputting circuit 19 which sub-samples the 8 $F_{so}$ data to produce 4 $F_{so}$ or 2 $F_{so}$ data. One of the 8 $F_{so}$, 4 $F_{so}$ or 2 $F_{so}$ data is selected by a multiplexor 19a.

The band-limiting filter 20 is a filter for preventing aliasing noise from being produced in output data. If the input sampling frequency $F_{si}$ is higher than the output sampling frequency $F_{so}$, there is a risk of the aliasing noise being produced, so that the output signal of the multiplexor 19a needs to be limited in bandwidth.

With the above-described sampling frequency converting device, the sampling frequency ratio detection circuit 24 of the control unit 26 detects the new sampling frequency ratio $R_{n\ NEW}$ represented by equation (1), in which error accumulation is not induced, as shown in FIG. 3, while the address control signal generating circuit 25 generates a control signal controlling the re-sampling time address and the interpolation factors from the new sampling frequency ratio $R_{n\ NEW}$. Thus it is possible with the present sampling frequency converting circuit to perform sampling frequency conversion by stable interpolation by the interpolation circuit 14 without producing overflow or underflow in the re-sampling buffer memory 13 or increasing the capacity of the re-sampling buffer memory 13. In addition, the output signal $D_{so}$ as an output signal having the sampling frequency $F_{so}$ is free of aliasing.

A third embodiment of the present invention will now be explained.

Like the above-described first and second embodiments, the present third embodiment is directed to a sampling frequency converting device for re-sampling the sampling frequency $F_{si}$ of the input signal $D_{si}$ into the signal $D_{so}$ having an arbitrary sampling frequency $F_{so}$, and realizes sampling frequency conversion in which the input system is completely asynchronous with respect to the output system, that is, sampling frequency conversion at a free conversion ratio without the relation of synchroneity between input and output signals. In the following description, the sampling frequency $F_{si}$ of the input signal $D_{si}$ is referred to as the input sampling frequency $F_{si}$, while the arbitrary sampling frequency $F_{so}$ is referred to as the output sampling frequency $F_{so}$. The schematic arrangement of the present third embodiment may be explained by referring to FIG. 4 showing the schematic arrangement of the above-described second embodiment. The difference between the present third embodiment and the second embodiment resides in the practical arrangement and operation of the control unit 26.

Figure 7:
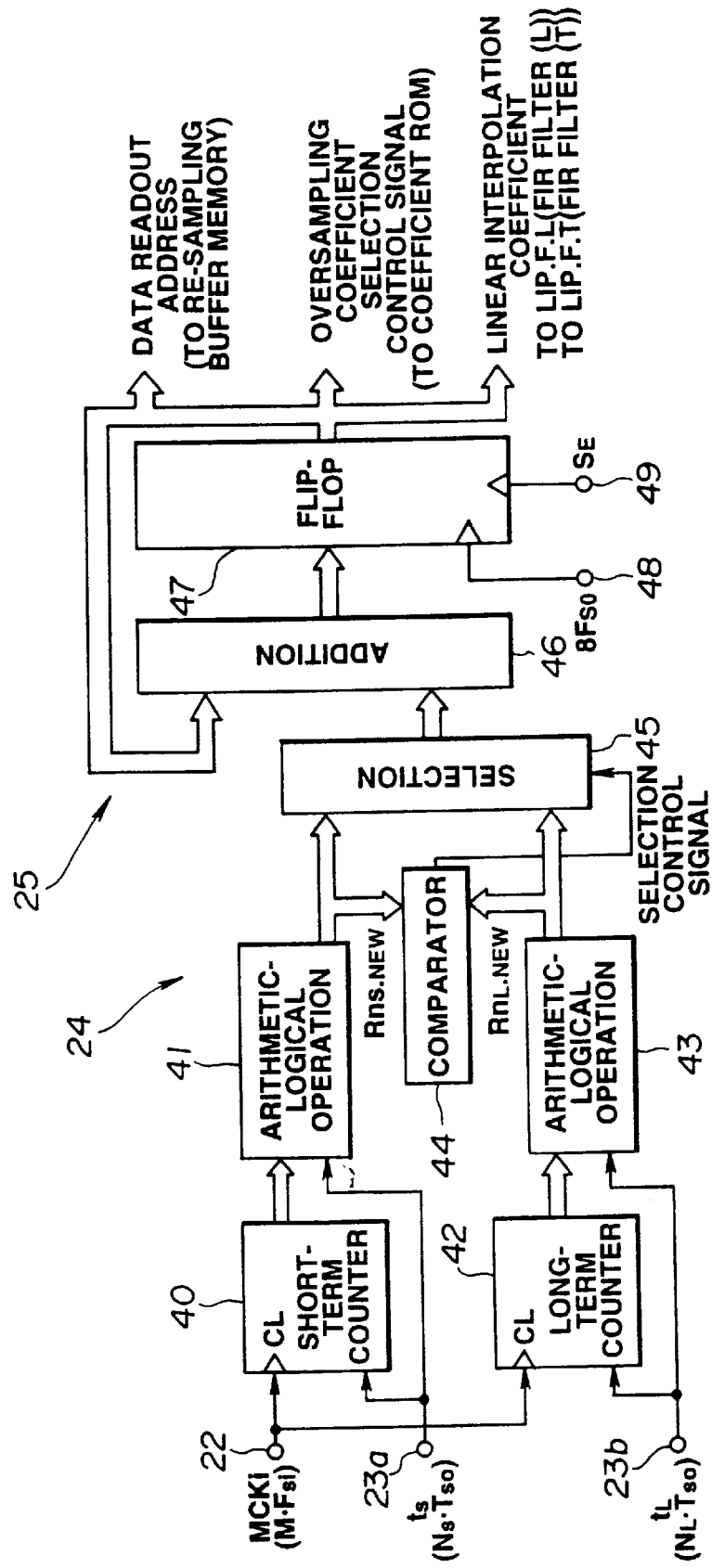
FIG. 7 is a schematic block diagram showing an arrangement of a controller employed in a sampling converting device as a third embodiment of the present invention.
Figure 8:
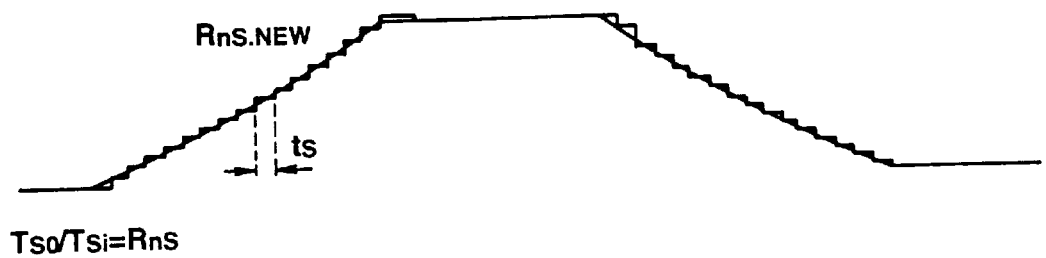
FIG. 8 illustrates the short time period (short-term) sampling frequency ratio detecting operation in the sampling frequency converting device shown in FIG. 7.
Figure 9:
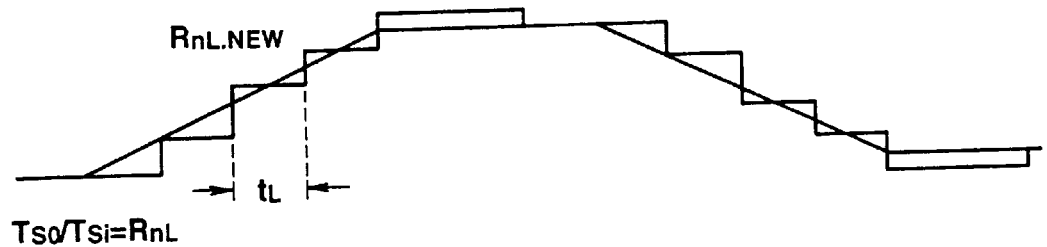
FIG. 9 illustrates the long-term sampling frequency ratio detecting operation in the sampling frequency converting device shown in FIG. 7.

Although the third embodiment is now explained by referring to FIG. 4 and additionally to FIGS. 7 to 9, the following description is mainly centered about the practical construction and the operation of the control unit 26 for the above reason.

Referring to FIG. 4, the sampling frequency converting circuit of the present third embodiment comprises an 8 $F_{so}$ over-sampling filter 12, a re-sampling buffer memory 13, an interpolation circuit 14, a control unit 26, a re-sampling frequency signal outputting circuit 19 and a band-limiting filter 20. The control unit counts the period t ($=N \cdot T_{so}$) supplied at the input terminal 23 by the input master clocks $MCK_i$ ($=M \cdot F_{si}$) supplied at the input terminal 22 over a shorter time period $t_s$ and a longer time period $t_L$ to produce the current detected value $R_{ns}$ and $R_{nL}$ at the shorter time period $t_s$ and a longer time period $t_L$ and generates a new sampling frequency ratio $R_{ns\ NEW}$ and new sampling frequency ratio $R_{nL\ NEW}$ over a shorter time period $t_s$ and a longer time period $t_L$ based on the current detected values $R_{ns}$ and $R_{nL}$ and past detection values $R_{ns-1}$ and $R_{nL-1}$ preceding the current values by one detection period. The control unit also generates a control signal controlling the address signal of the re-sampling buffer memory 13 and the interpolation factors of the interpolation circuit 14 from one of the new sampling frequency ratio $R_{ns\ NEW}$ and new sampling frequency ratio $R_{nL\ NEW}$ and controls the re-sampling buffer memory 13 and the interpolation circuit 14 based on the generated address signal and the control signal to produce the sampling frequency conversion ratio.

The control unit 26 has a sampling frequency ratio detection circuit 24 and an address control signal generating circuit 25. The sampling frequency ratio detection circuit 24 detects the values of the current sampling frequency ratio $R_{ns}$ and $R_{nL}$ by counting the short time period (short-term) $t_s$ and the long time period (long-term) $t_L$ supplied from the input terminal 23 by the master clocks $MCK_i$ ($=M \cdot F_i$) supplied at the input terminal 22 and determines the values of the new sampling frequency ratio $R_{ns\ NEW}$ and $R_{nL\ NEW}$ over the (short-term) $t_s$ and the long time period (long-term) $t_L$ based on the values of the current sampling frequency ratio $R_{ns}$ and $R_{nL}$. The address control signal generating circuit 25 generates a control signal controlling the interpolation factor of the interpolation circuit 14 and the address signal of the re-sampling buffer memory 13 based on the values of the new sampling frequency ratio $R_{ns\ NEW}$ and $R_{nL\ NEW}$.

Referring to FIG. 7, the sampling frequency ratio detection circuit 24 includes a short-term counter 40 for counting the sampling period $N_s \cdot T_{so}$ at the short time period $t_s$ entering at the input terminal 23a by the input master clock $MCK_i$ at an input terminal 22, and an arithmetic-logic unit 41 for determining a new sampling frequency ratio $R_{ns\,NEW}$ at the shorter period $t_s$ based on the current sampling frequency ratio $R_{ns}$ which is the count output of the short-term counter 40. The detection circuit 24 also includes a long-term counter 42 for counting the sampling period $N_L \cdot T_{so}$ at the long time period $t_L$ entering at the input terminal 23b by the input master clock $MCK_i$ at an input terminal 22, and an arithmetic-logic unit 43 for determining a new sampling frequency ratio $R_{nL\,NEW}$ at the longer period $t_L$ based on the current sampling frequency ratio $R_{nL}$ which is the count output of the long-term counter 42. The detection circuit 24 finally includes a comparator circuit 44 for comparing the new sampling frequency ratio $R_{ns\,NEW}$ at the shorter period $t_s$ as determined by the arithmetic-logic unit 41 to the new sampling frequency ratio $R_{nL\,NEW}$ at the longer period $t_L$ as found by the arithmetic-logic unit 43, and a selection circuit 45 responsive to the result of comparison at the comparator circuit 44 to select and output one of the new sampling frequency ratio $R_{ns\,NEW}$ at the shorter period $t_s$ or the new sampling frequency ratio $R_{nL\,NEW}$ at the longer period $t_L$.

The arithmetic-logic unit 41 doubles the current sampling frequency ratio $R_{ns}$ to give $2R_{ns}$ and subtracts the past sampling frequency ratio $R_{ns-1}$ from $2R_{ns}$ to determine a new sampling frequency ratio $R_{ns\,NEW}$ for the short period $t_s$. This is equivalent to adding a difference $\Delta R_{ns}$ between the sampling frequency ratio $R_{ns}$ at the current short period $t_s$ and the past detection value $R_{ns-1}$ preceding the current value of the sampling frequency ratio $R_{ns}$ by one detection period, as shown in FIG. 8. That is, the new sampling frequency ratio $R_{ns\,NEW}$ for the short period $t_s$ becomes $$R_{ns\,NEW} = R_{ns} + \Delta R_{ns} = R_{ns} + (R_{ns} - R_{ns-1}) = 2R_{ns} - R_{ns-1} \quad (2)$$

On the other hand, the arithmetic-logic unit 43 doubles the current sampling frequency ratio $R_{nL}$ to give $2R_{nL}$ and subtracts the past sampling frequency ratio $R_{nL}$ from $2R_{nL}$ to determine a new sampling frequency ratio $R_{nL\,NEW}$ for the long period $t_L$. This is equivalent to adding a difference $\Delta R_{nL}$ between the sampling frequency ratio $R_{nL}$ at the current long period $t_L$ and the past detection value $R_{nL-1}$ preceding the current value of the sampling frequency ratio $R_{nL}$ by one detection period, as shown in FIG. 9. That is, the new sampling frequency ratio $R_{nL\,NEW}$ for the long period $t_L$ becomes $$R_{nL\,NEW} = R_{nL} + \Delta R_{nL} = R_{nL} + (R_{nL} - R_{nL-1}) = 2R_{nL} - R_{nL-1} \quad (3)$$

The new sampling frequency ratio $R_{ns\,NEW}$ of the short time period (short term) $t_s$, as found by the arithmetic-logic unit 41, and the new sampling frequency ratio $R_{nL\,NEW}$ of the long time period (long term) $t_L$, as determined by the arithmetic-logic unit 43, are fed to the comparator 44. The comparator 44 determines whether the new sampling frequency ratio $R_{ns\,NEW}$ for the short time period (short term) $t_s$ and the new sampling frequency ratio $R_{nL\,NEW}$ for the long time period (long term) $t_L$ are coincident with each other within predetermined accuracy. That is, the comparator circuit 44 compares the new sampling frequency ratio $R_{ns\,NEW}$ for the short time period (short term) $t_s$ having a larger number of bits to the new sampling frequency ratio $R_{nL\,NEW}$ for the long time period (long term) $t_L$ having a smaller number of bits. Such comparison is made for a predetermined number of bits from the LSB of the new sampling frequency ratio $R_{ns\,NEW}$ depending on the total number of bits of the new sampling frequency ratio $R_{nL\,NEW}$ and the total number of bits of the new sampling frequency ratio $R_{ns\,NEW}$. In this manner, the two frequency ratio values may be discriminated as to the possible coincidence within a predetermined range. When the comparator circuit 44 determines that the new sampling frequency ratio $R_{nL\,NEW}$ and the new sampling frequency ratio $R_{ns\,NEW}$ are coincident with each other within predetermined accuracy, it issues a selection control signal to the selection circuit 45 to select and output the new sampling frequency ratio $R_{nl\,NEW}$ for the long term. Conversely, when the comparator circuit 44 determines that the new sampling frequency ratio $R_{nL\,NEW}$ and the new sampling frequency ratio $R_{ns\,NEW}$ are not coincident with each other, it issues a selection control signal to the selection circuit 45 to select and output the new sampling frequency ratio $R_{ns\,NEW}$ for the short term.

The selection circuit 45 is responsive to the selection control signal to select and output the new sampling frequency ratio $R_{nL\,NEW}$ for the long term or the new sampling frequency ratio $R_{ns\,NEW}$ for the short term.

The address control signal generating circuit 25 cumulatively adds the new sampling frequency ratio $R_{nL\,NEW}$ or the new sampling frequency ratio $R_{ns\,NEW}$ as selected by the selection circuit 45, using an addition circuit 46 and the flip-flop circuit 47 to generate data readout addresses for the re-sampling buffer memory 13. The address control signal generating circuit 25 also is responsive to the new sampling frequency ratio $R_{nL\,NEW}$ or the new sampling frequency ratio $R_{ns\,NEW}$ as selected by the selection circuit 45 to generate the selection control signal for the over-sampling factors employed for over-sampling carried out in the interpolation circuit 14 and the leading and trailing linear interpolation factors for linear interpolation (LIP.F.L and LIP.F.T.) and to transmit the generated signals to the interpolation circuit 14.

The flip-flop circuit 47 is preferably a D-flip-flop circuit. From the input terminal 48 are fed $8F_{so}$ clocks which are in keeping with the sampling frequency of $8F_{so}$ of the output signals of the present third embodiment. Of course, if the sampling frequency of the output signal is $4F_{so}$ or $2F_{so}$, $4F_{so}$ or $2F_{so}$ clocks are transmitted. From the input terminal 49 are supplied initializing signals $S_E$.

Since the construction and operation of the interpolation circuit 14 are identical with those of the circuit shown in FIGS. 4 and 6, the corresponding description is omitted for simplicity.

With the sampling frequency converting device of the present third embodiment, the sampling frequency ratio detection circuit 24 outputs the new sampling frequency ratio $R_{nL\,NEW}$ or the new sampling frequency ratio $R_{ns\,NEW}$ which is free from error accumulation as shown in FIG. 8 or 9, while the address control signal generating circuit 25 generates a control signal for controlling the re-sampling time address or the interpolation factors. Thus it is possible with the present third embodiment of the sampling frequency converting circuit to perform sampling frequency conversion using stable interpolation by the interpolation circuit 14 without producing overflow or underflow in the re-sampling buffer memory 13 or increasing the capacity of the re-sampling buffer memory 13. In addition, the output signal $D_{so}$ as an output signal having the sampling frequency $F_{so}$ is free of aliasing.

The fourth embodiment will now be explained.

Since the present fourth embodiment differs from the above-described third embodiment only with respect to the control unit 26, the following description of the remaining components is made for simplicity.

Figure 10:
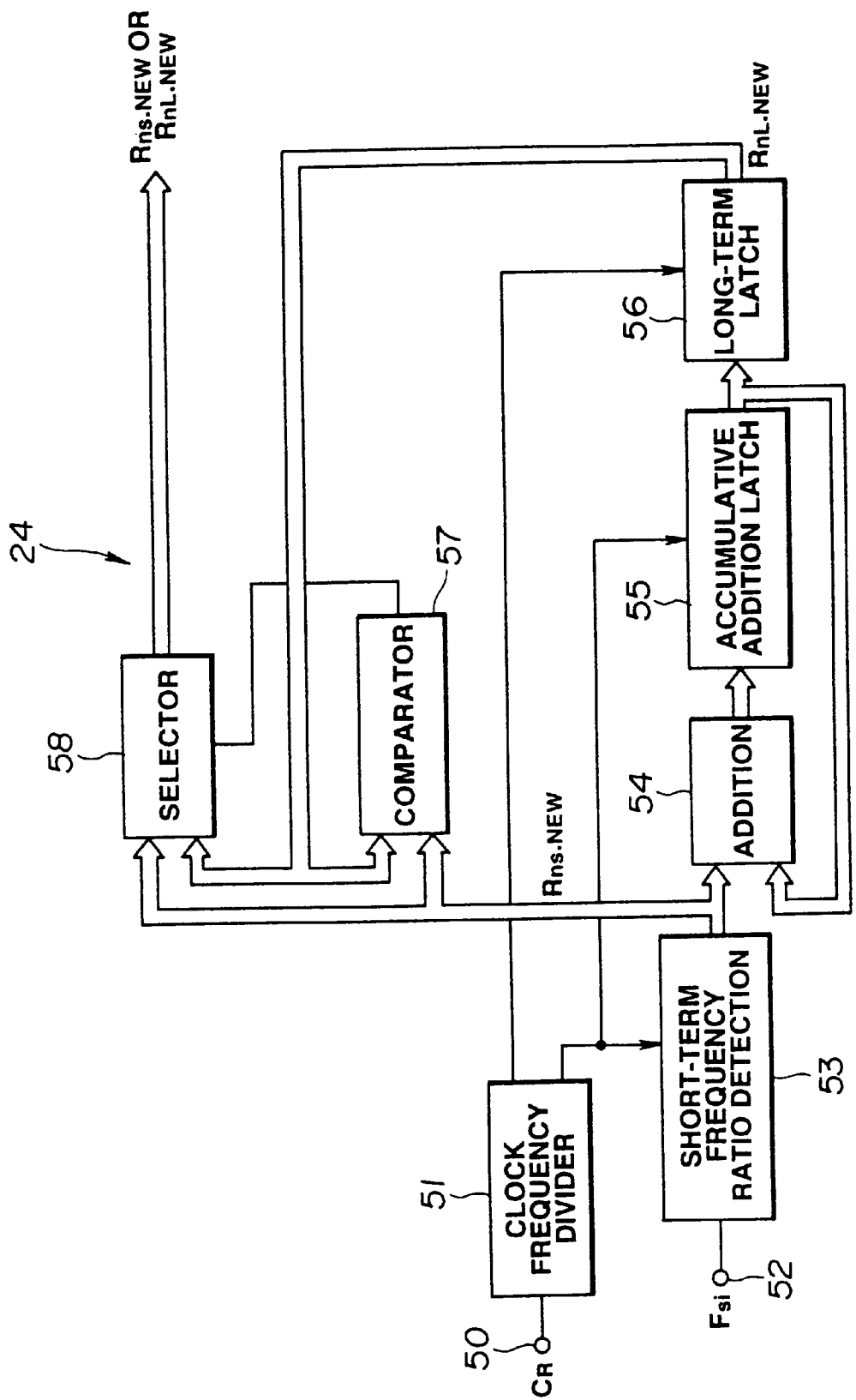
FIG. 10 is a schematic block diagram showing a sampling frequency ratio detection circuit employed in a sampling frequency converting device as a fourth embodiment of the present invention.

With the present fourth embodiment, the long-term counter 42 is omitted in constructing the sampling frequency ratio detection circuit 24 of the control unit 26, as shown in FIG. 10, instead of providing the short term counter 40 and the long term counter 42, as in the above-described third embodiment.

The new sampling frequency ratio $R_{ns\ NEW}$, an output of the short-term sampling frequency ratio detection circuit 53 having the short term counter, is fed not only to a comparator circuit 57 and a selection circuit 58 but also to an addition circuit 54. The addition circuit 54, inherently employed in the address control signal generating circuit 25, as in the addition circuit 46 shown in FIG. 7, may be employed time-divisionally. Thus the addition circuit 54 employs an accumulative addition latch 55 to cumulatively add the values of the new sampling frequency ratio $R_{ns\ NEW}$ to adaptively produce the new sampling frequency ratio $R_{nL\ NEW}$. This new sampling frequency ratio $R_{nL\ NEW}$ is fed via a long-term latch 56 to the comparator circuit 57 and to the selection circuit 58.

Thus, with the present fourth embodiment, the comparator circuit 57 determines whether the new sampling frequency ratio $R_{ns\ NEW}$ at the short term $t_s$ based on the count output obtained by counting the sampling frequency $F_{si}$ of input signals at an input terminal 52 is coincident with the new sampling frequency ratio $R_{nL\ NEW}$ at the long term $t_L$ obtained on cumulative addition of the new sampling frequency ratio $R_{ns\ NEW}$ using the addition circuit 54 and the cumulative addition latch 55 and counting using frequency-dividing clocks at the long-term latch 56 within predetermined accuracy, and the selection circuit 58 selects and outputs the new sampling frequency ratio $R_{nL\ NEW}$ or the new sampling frequency ratio $R_{ns\ NEW}$ in case of coincidence and non-coincidence, respectively. The clock frequency divider 51 frequency-divides the reference clocks supplied at an input terminal 50 to transmit the resulting frequency-divided clocks to a short-term sampling frequency ratio detection circuit 53, a cumulative addition latch circuit 55 and to a long-term latch circuit 56. Thus it is possible with the present fourth embodiment of the sampling frequency converting circuit to eliminate the long-term counter and to perform sampling frequency conversion by stable interpolation using the interpolation circuit 14 without producing overflow or underflow in the re-sampling buffer memory or increasing the capacity of the re-sampling buffer memory. In addition, the output signal $D_{so}$ as an output signal having the sampling frequency $F_{so}$ is free of aliasing.

A fifth embodiment will now be explained.

Figure 11:
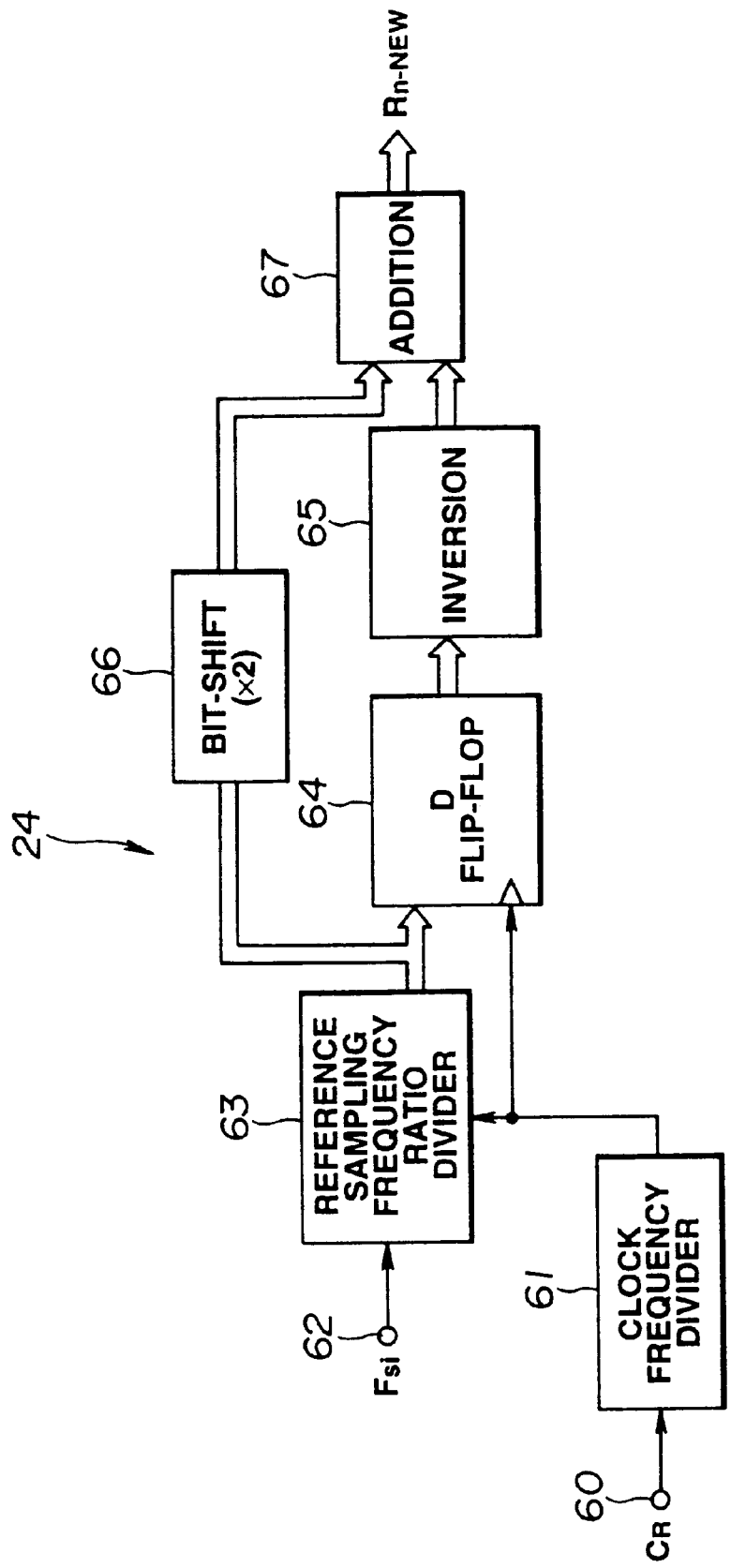
FIG. 11 is a schematic block diagram showing a sampling frequency ratio detection circuit employed in a sampling frequency converting device as a fifth embodiment of the present invention.

With the present fifth embodiment, the sampling frequency ratio detection circuit 24 of the second embodiment shown in FIG. 5 is configured as shown in FIG. 11.

With the sampling frequency ratio detection circuit 24, employed in the present fifth embodiment of the sampling frequency converting device, a past detected value $R_{n-1}$ preceding the current detection period by one detection period is subtracted from twice the current sampling frequency ratio $R_n$ to determine a new sampling frequency ratio $R_{n\ NEW}$.

Thus, with the present fifth embodiment, the sampling frequency ratio $F_{si}$ of an input signal at an input terminal 62 is counted by a reference sampling frequency ratio detection circuit 63 using the frequency-divided clocks to produce the current sampling frequency ratio $R_n$ which is then supplied via a D-flip-flop circuit 64 and an inverting circuit 65 to an addition circuit 67 and added by the addition circuit 67 via a bit shifter 66 to the sampling frequency ratio $R_n$. The bit shifter 66 produces a frequency ratio value twice the current frequency ratio, or $2R_n$, while the D-flip-flop circuit 64 and the inverting circuit 65 produce a frequency ratio value $-R_{n-1}$ which is inverted in sign from the frequency ratio value $R_{n-1}$ preceding the current sampling frequency $R_n$ by one detection period. Thus the addition circuit 67 performs an arithmetic operation shown by equation (1). The clock frequency divider 61 routes the frequency-divided clocks, produced by frequency-dividing the reference clocks $C_R$ supplied at the input terminal 60, to the reference sampling frequency circuit 63 and to the D-flip-flop circuit 64.

Thus, with the present fifth embodiment, the current sampling frequency ratio $R_n$ is measured from the input sampling frequency $F_{si}$ and the output sampling frequency $F_{so}$ and a new sampling frequency ratio $R_{n\ NEW}$ is determined on the basis of the current detection value $R_n$ and the past detected value $R_{n-1}$. Since it is possible with the address control signal generating circuit 25 to generate the re-sampling time addresses from the new sampling frequency ratio $R_{n\ NEW}$ free from error accumulation as in FIG. 3, it becomes possible to perform sampling frequency conversion by stable interpolation using the interpolation circuit 14 without producing overflow or underflow in the re-sampling buffer memory 13 or increasing the capacity of the re-sampling buffer memory 13.

A sixth embodiment will now be explained.

Figure 12:
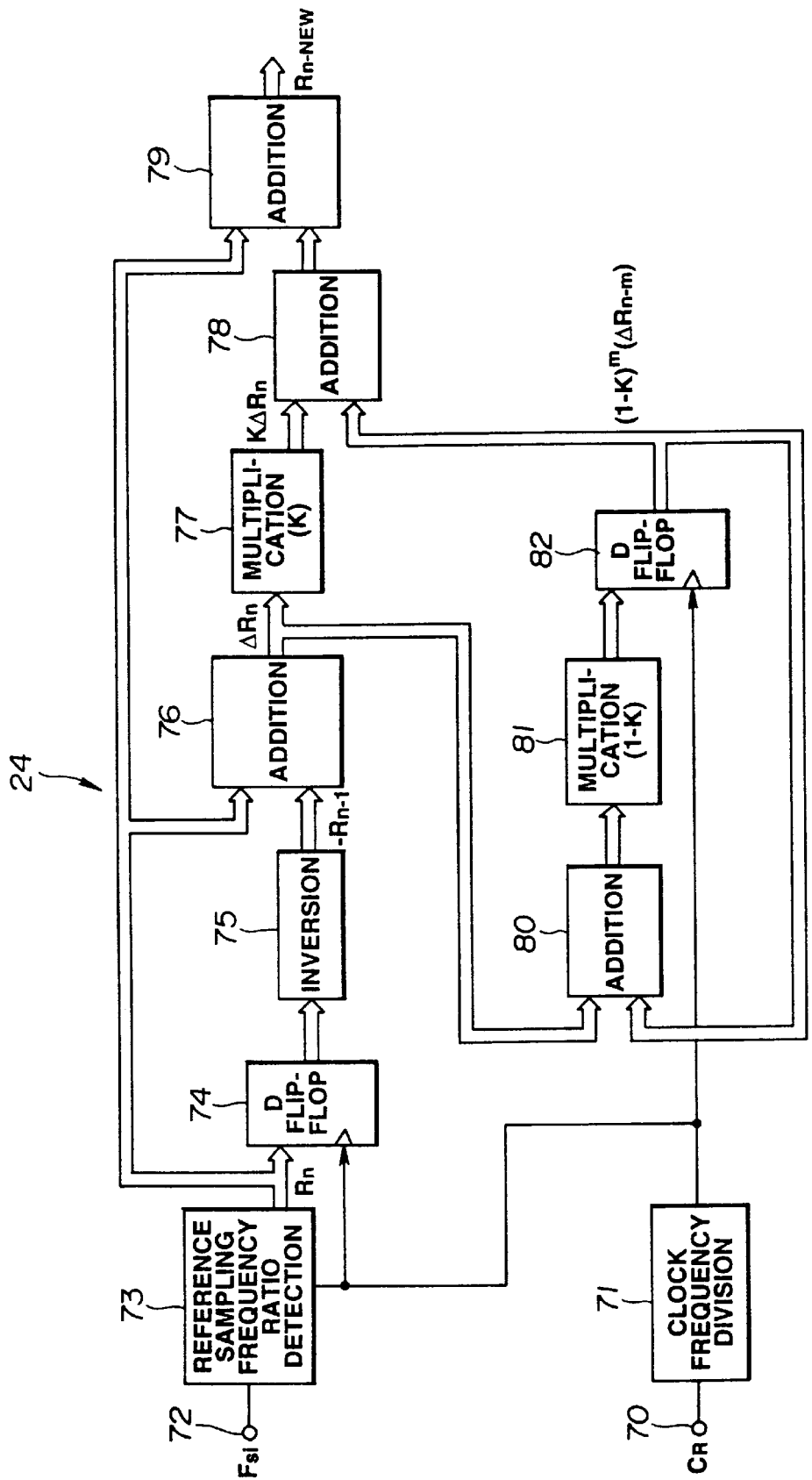
FIG. 12 is a schematic block diagram showing a sampling frequency ratio detection circuit employed in a sampling frequency converting device as a sixth embodiment of the present invention.

In the present sixth embodiment, the sampling frequency ratio detection circuit 24 employed in the second embodiment shown in FIG. 5 is configured as shown in FIG. 12.

A reference sampling frequency ratio detection circuit 73 detects the current sampling frequency ratio $R_n$ by counting, with the frequency-divided clocks obtained on frequency-dividing master clocks $C_R$ by frequency divider 71 the sampling frequency $F_{si}$ of the input signal at an input terminal 72. The current sampling frequency ratio $R_n$ is fed via a D-flip-flop circuit 74 and an inverter circuit 75 to an addition circuit 76 where it is added to the current sampling frequency ratio $R_n$. The D-flip-flop circuit 74 and the inverting circuit 75 generates a frequency ratio value $-R_{n-1}$ inverted in sign from the value $R_{n-1}$ preceding the current value $R_n$ by one detection period. Thus the addition circuit 76 outputs a difference $\Delta R_n$ between the current sampling frequency ratio $R_n$ and the sampling frequency ratio $R_{n-1}$ preceding the current value $R_n$ by one detection period.

The difference $\Delta R_n$ is fed to a multiplication circuit 77 and to an addition circuit 80. The multiplication circuit 77 multiplies the difference $\Delta R_n$ with a coefficient k (k<1) and routes the resulting product to an addition circuit 78. An addition circuit 80 cumulatively adds to the difference $\Delta R_n$ the output signals of the D-flip-flop 82 as later explained.

An output signal of the addition circuit 80 is fed to a multiplication circuit 81 so as to be multiplied by (1−k). An output signal of the multiplication circuit 81 is fed to a D-flip-flop 82, which then counts the output signals of the multiplication circuit 81 based upon the frequency-divided clocks supplied from the clock frequency divider 71 to output a ratio value preceding the current ratio value by m detection periods. Thus a feedback circuit made up of the addition circuit 80, multiplication circuit 81 and the D-flip-flop circuit 82 becomes a circuit for finding an infinite series $(1-k)^m(\Delta R_{n-m})$.

The infinite series $(1-k)^m(\Delta R_{n-m})$ of the feedback circuit is added to the result of multiplication $k\Delta R_n$ from the multiplication circuit 77 at the addition circuit 78. An addition output of the addition circuit 78 is fed to an addition circuit 79, which adds the addition output of the addition circuit 78 to the current sampling frequency ratio $R_n$ to output a new sampling frequency ratio $R_{n\ NEW}$.

The clock frequency divider 71 routes the frequency-divided clocks obtained on frequency dividing the reference $C_R$ supplied from the input terminal 70, to the sampling frequency ratio detection circuit 73, D-flip-flop 74 and to the D-flip-flop circuit 82.

Thus, with the present sixth embodiment, the current sampling frequency ratio $R_n$ is measured from the input sampling frequency $F_{si}$ and the output sampling frequency $F_{so}$, and $k\Delta R_n$ from the D-flip-flop 74 and the inverting circuit 75 is summed to the infinite series (the sum of the output $(1-k)^m(9\Delta R_{n-m})$ of the feedback circuit made up of the addition circuit 80, the multiplication circuit 81 and the D-flip-flop 82, from m=1 up to m=infinite) to give the new sampling frequency ratio $R_{n\,NEW}$ as indicated by the following equation (4):

$$R_{n,NEW} = R_n + k\Delta R_n + \sum_{m=1}^{\infty}(1-k)^m(\Delta R_{n-m}) \quad (4)$$

where $\Delta R_n = R_{n-1}$ and k<1.

Figure 13:
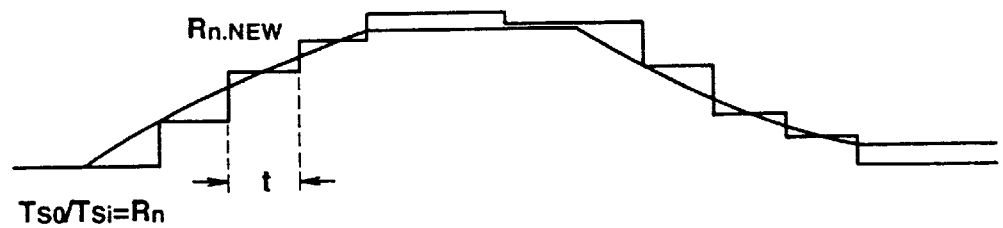
FIG. 13 illustrates the operation of a sampling frequency ratio detection circuit provided in the sampling frequency converting device shown in FIG. 12.

With the present sixth embodiment, the new sampling frequency ratio $R_{n\,NEW}$ is output to the address control signal generating circuit 25. Since it is possible with the address control signal generating circuit 25 to generate the re-sampling time addresses from the new sampling frequency ratio $R_{n\,NEW}$ free from error accumulation as in FIG. 13, it becomes possible to perform sampling frequency conversion by stable interpolation using the interpolation circuit without producing overflow or underflow in the re-sampling buffer memory 13 or increasing the capacity of the re-sampling buffer memory 13.

Figure 14:
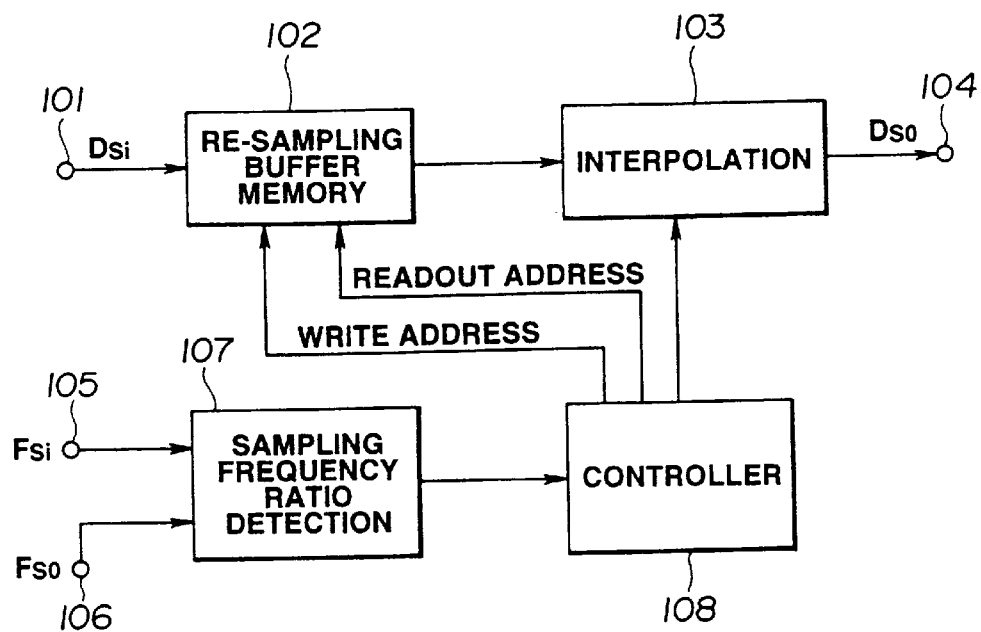
FIG. 14 is a schematic block diagram showing an arrangement of a sampling frequency converting device as a seventh embodiment of the present invention.

Referring to FIG. 14, a seventh embodiment will now be explained.

The seventh embodiment comprises a re-sampling buffer memory 102 for storing the input signal $D_{si}$ of the input sampling frequency $F_{si}$ entering at the input terminal 101, and an interpolation circuit 103 for interpolating readout signals from the re-sampling buffer memory 102. The seventh embodiment also comprises a sampling frequency ratio detection circuit 107 and a controller 108. The frequency ratio detection circuit detects the ratio of the input sampling frequency $F_{si}$ supplied from the input terminal 105 to the output sampling frequency $F_{so}$ from the input terminal 106 over a short time period and over a long time period. The controller 108 is responsive to the sampling frequency ratio over the short time period and to the sampling frequency ratio over the long time period from the detection circuit 107 to control the re-sampling buffer memory 102 and the interpolation circuit 103. The interpolation circuit 103, whose interpolating operation is controlled by the controller 108, outputs a signal $D_{so}$ having the output sampling frequency $F_{so}$ at the output terminal 104.

The sampling frequency ratio detection circuit 107 detects the sampling frequency ratio $R_s$ and the sampling frequency ratio $R_L$, each of which is the ratio of the input sampling frequency $F_{si}$ to the output sampling frequency $F_{so}$ over the short time period and that over the long period, respectively.

The sampling frequency ratio detection circuit 107 detects whether the sampling frequency ratio $R_s$ over the short time period and the sampling frequency ratio $R_L$ over the long time period coincide with each other within predetermined accuracy. The detection circuit 107 selects the sampling frequency ratio $R_L$ for detection over a long time period and the sampling frequency ratio $R_s$ for detection over a short time period in case of coincidence and non-coincidence, respectively, and outputs the selected value to the controller 108.

The controller 108 is responsive to the sampling frequency ratio values $R_L$ or $R_s$ transmitted from the sampling frequency ratio detection circuit 107 to generate re-sampling time addresses as data readout addresses which are transmitted to the re-sampling buffer memory 102. On the other hand, the controller 108 is responsive to the sampling frequency ratio $R_L$ or $R_s$ to generate the selection control signal for the over-sampling factors employed in over-sampling performed by the interpolation circuit 103 and the leading and trailing linear interpolation factors and to transmit the generated signals to the interpolation circuit 103.

The interpolation circuit 103 reads out necessary data from the re-sampling buffer memory, based upon the above-mentioned re-sampling time addresses, generates two mutually adjacent high-order interpolation data associated with the re-sampling time addresses by, for example, FIR filtering, while processing the resulting data with linear interpolation and summing the resulting data to each other to generate a signal $D_{so}$ having an output sampling frequency $F_{so}$.

The sampling frequency ratio detection circuit 107 detects whether the sampling frequency ratio $R_s$ over the short time period and the sampling frequency ratio $R_L$ over the long time period coincide with each other within predetermined accuracy. The detection circuit 107 selects the sampling frequency ratio $R_L$ for detection over a long time period and the sampling frequency ratio $R_s$ for detection over a short time period in case of coincidence and non-coincidence, respectively, and outputs the selected value to the controller 108.

Figure 15A:
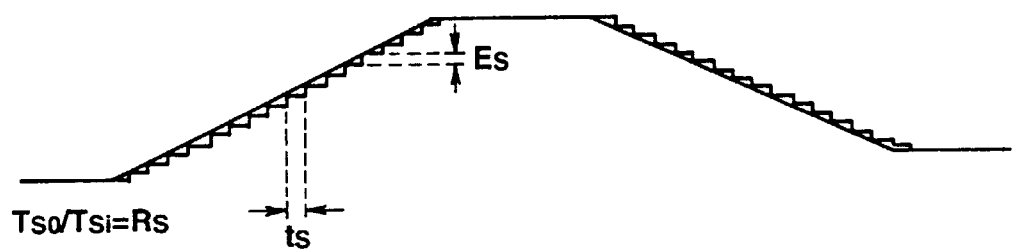
FIGS. 15A and 15B illustrate the short time period (short-term) sampling frequency ratio detection operation and the long time period (long-term) sampling frequency ratio detection operation by the sampling frequency converting device shown in FIG. 14.
Figure 15B:
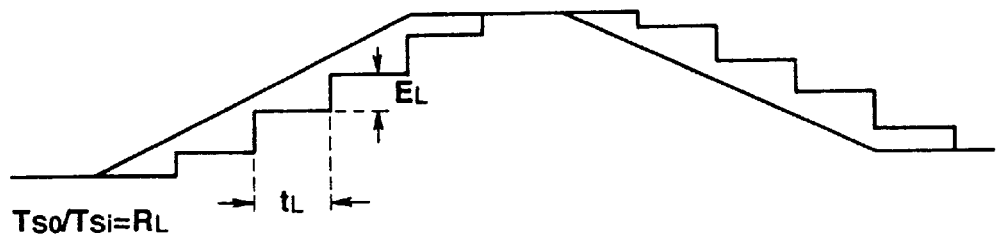

If the ratio between the input sampling frequency $F_{si}$ and the output sampling frequency $F_{so}$ is detected over a short time period $t_s$, the error $E_s$ becomes smaller as shown in FIG. 15A, thus enabling high-speed response to the error. However, the resolution becomes small which makes it difficult to maintain high accuracy. Conversely, if the ratio between the input sampling frequency $F_{si}$ and the output sampling frequency $F_{so}$ is detected over a long time period $t_L$, the error $E_L$ becomes larger as shown in FIG. 15B, thus enabling high resolution and high accuracy, although it becomes difficult to achieve high-speed response to the error. For this reason, the sampling frequency ratio detection circuit 107 detects whether the sampling frequency ratio $R_s$ over the short time period and the sampling frequency ratio $R_L$ over the long time period coincide with each other within predetermined accuracy. The detection circuit 107 selects the sampling frequency ratio $R_L$ for detection over a long time period and the sampling frequency ratio $R_s$ for detection over a short time period in case of coincidence and non-coincidence, respectively, and outputs the selected value to the controller 108.

Such detection within the predetermined accuracy may be achieved by comparing the sampling frequency ratio $R_s$ over the short time period and the sampling frequency ratio $R_L$ over the long time period only with respect to a predetermined range of bits. For example, in handling the sampling frequency ratio as a digital value, such comparison is made for a predetermined number of bits from the MSB of the sampling frequency ratio $R_L$ corresponding to the total number of bits of the sampling frequency ratio $R_s$ and the total number of bits of the sampling frequency ratio $R_s$ with the smaller number of bits.

Consequently, the sampling frequency converting device of the present seventh embodiment adaptively changes over the high-speed re-sampling time address generation to the high-precision re-sampling time address generation or vice versa depending on the sampling frequency ratio, and performs the sampling frequency conversion responsive to the re-sampling time address generated with high precision if the variation in the sampling frequency is not produced within pre-set accuracy, while performing the sampling frequency conversion responsive to the re-sampling time address generated at a high speed if the variation in the sampling frequency is produced within predetermined accuracy. Thus it becomes possible with the present seventh embodiment to prevent the playback audio signals from being deteriorated due to the difference in the sampling frequencies and to realize mixing by free sampling frequency conversion.

Figure 16:
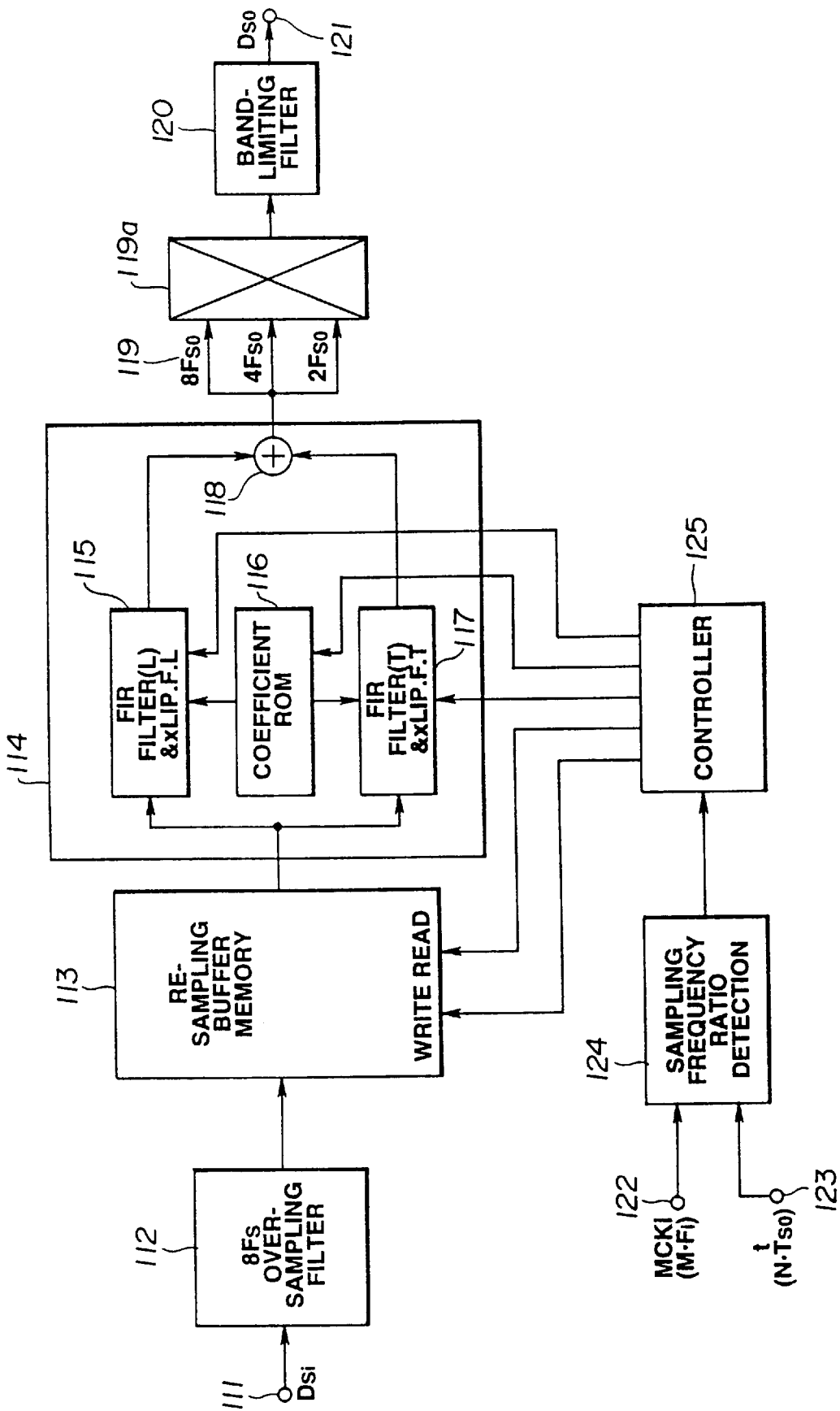
FIG. 16 is a schematic block diagram showing an arrangement of a sampling frequency converting device as an eighth embodiment of the present invention.
Figure 17:
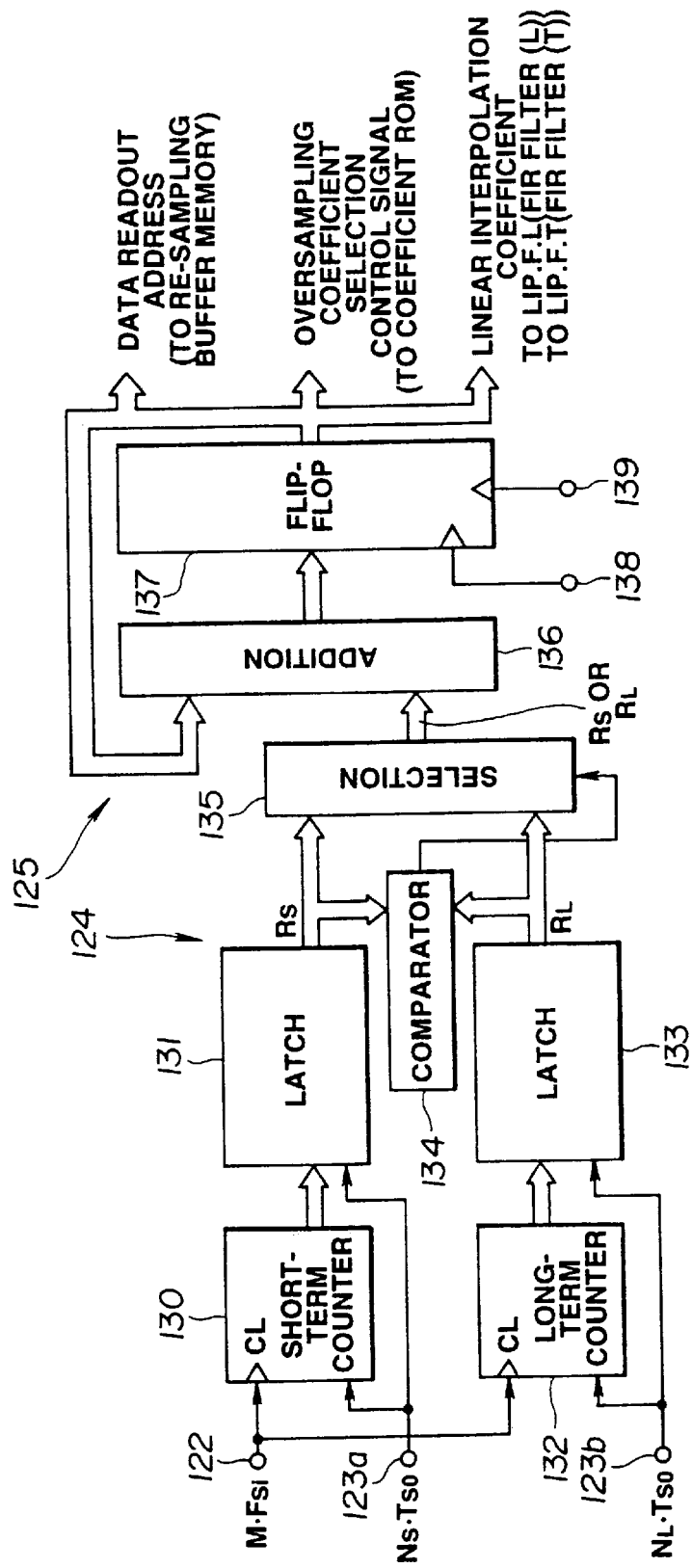
FIG. 17 is a schematic block diagram showing a sampling frequency ratio detection circuit and a controller employed in the sampling frequency converting device shown in FIG. 16.

Referring to FIGS. 16 and 17, an eighth embodiment will now be explained.

The present eighth embodiment comprises an 8 $F_{si}$ over-sampling filter 112 for over-sampling the input signal $D_{si}$ at the input terminal 111 of FIG. 16, with the input sampling frequency of $F_{si}$, to 8 $F_{si}$ for re-sampling, and a re-sampling buffer memory 113 for writing and reading the 8 $F_{si}$ input signal from the 8 $F_s$ over-sampling filter 112. The eighth embodiment also comprises an interpolation circuit 114 for interpolating the readout signals from the re-sampling buffer memory 113, and a sampling frequency ratio detection circuit 124. The sampling frequency ratio detection circuit 124 detects over a short time period and over a long time period the sampling frequency ratio improved in resolution by counting the output sampling periods t (t=N·$T_{so}$) equal to N times the period of the output sampling frequency $F_{so}$ supplied at the input terminal 123 by input reference clocks which is an integer number multiple of the sampling frequency $F_{si}$ supplied at the input terminal 122 (input master clocks MCK$_i$ equal to M·$F_{si}$). The eighth embodiment also comprises a controller 125, a re-sampling frequency signal outputting circuit 119 and a band-limiting filter 120. The controller 125 is responsive to the sampling frequency ratio over the short time period or that over a ling time period, as detected by the sampling frequency ratio detection circuit 124, to control the re-sampling buffer memory 113 and the interpolation circuit 114. The re-sampling frequency signal outputting circuit 119 sub-samples the sampling frequency of the output signal of the interpolation circuit 114 having its operation of interpolation controlled by the controller 125 for converting the sampling frequency into the output sampling frequency $F_{so}$ equal to 2, 4 and 8 times the frequency of the output signal of the interpolation circuit 114, and selects one of the values of the output sampling frequency $F_{so}$ equal to 2, 4 and 8 times. The band-limiting filter 120 limits the bandwidth of the output signal of the re-sampling frequency signal outputting circuit 119 and outputs the output signal $D_{so}$ having the output sampling frequency $F_{so}$ at the output terminal 121.

The digital signal having the sampling frequency 8$F_{si}$, produced by the 8 $F_{si}$ over-sampling filter 112, is fed to the re-sampling buffer memory 113, as described above. This re-sampling buffer memory 113 is a 20-bit, 64-word buffer RAM, thus having a sampling frequency time eight times as large as the input sampling frequency time.

Referring to FIG. 17, the sampling frequency ratio detection circuit 124 comprises a short-term counter 130 for counting the integer number multiple sampling period $N_s·T_{sc}$ at the short time period $t_s$ entering the input terminal 123a, with the input master clocks MCK$_i$ fed at the input terminal 122, and a latch 131 for latching the count output at the short-term counter 130 based on the sampling period $N_s·T_{sc}$. The sampling frequency ratio detection circuit 124 comprises a long-term counter 132 for counting the integer number multiple sampling period $N_L·T_{sc}$ at the long time period $t_L$ entering the input terminal 123b, with the input master clocks MCK$_i$ fed at the input terminal 122, and a latch 133 for latching the count output at the long-term counter 132 based on the sampling period $N_L·T_{sc}$. The sampling frequency ratio detection circuit 124 further comprises a comparator circuit 134 for comparing a latch output of the latch 131 to the latch output of the latch 132 and a selection circuit 135 for selecting and outputting one of the latch output at the controller 125 responsive to the result of comparison by the comparator circuit 134.

The short-term counter 130 counts the sampling period $N_s·T_{sc}$ with the input master clocks MCK$_i$, while the latch 131 latches the count results, for determining the sampling frequency ratio $R_s$ over the short time period $t_s$. On the other hand, the long-term counter 132 counts the sampling period $N_L·T_{so}$ with the input master clocks MCK$_i$, while the latch 133 latches the count results, for determining the sampling frequency ratio $R_L$ over the long time period $t_L$, That is, the latch period by the latch 131 is the short term $t_s$ and that by the latch 133 is the long term $t_L$. These latch periods $t_s$ and $t_L$ are selected so that the resolution of the sampling frequency ratio $R_s$ is coincident with the error with respect to the real time of the sampling frequency ratio $R_L$ during the conversion for the maximum assumed rate of change of the input/output sampling frequency ratio.

Meanwhile, the input master clock MCK$_i$ is of a sufficiently higher rate than the sampling periods $N_s·T_{so}$ or $N_L·T_{so}$ and is of the frequency equal to M times the input sampling frequency $F_{si}$, where M is an integer.

The comparator circuit 134 determines whether the sampling frequency ratio $R_s$ is coincident with the sampling frequency ratio $R_L$ within predetermined accuracy. If the comparator circuit 134 determines that the sampling frequency ratio $R_s$ is or is not coincident with the sampling frequency ratio $R_L$, the comparator circuit 134 transmits the corresponding selection control signal to the selection circuit 135.

The selection circuit 135 is responsive to the selection control signal supplied from the comparator circuit 135 to select and output the sampling frequency ratio $R_s$ or $R_L$ from the latch 131 or from the latch 133.

The comparator circuit 134 compares the sampling frequency ratio $R_L$ having a larger number of bits to the sampling frequency ratio $R_L$ having a smaller number of bits. For such comparison, a range of bits from the MSB of the sampling frequency ratio $R_L$ as far as a predetermined bit corresponding to the total number of bits of the sampling frequency ratio $R_s$ is compared to the total bits of the sampling frequency ratio $R_s$. Thus it becomes possible to detect the possible coincidence within the predetermined range. If the comparator circuit 134 determines that the sampling frequency ratio $R_s$ is coincident with the sampling frequency ratio $R_L$ within a predetermined range, the comparator circuit issues a selection control signal instructing the selection circuit 135 to select and output the sampling frequency ratio $R_L$ at the longer period $t_L$. On the other hand, if the comparator circuit 134 determines that the sampling frequency ratio $R_s$ is not coincident with the sampling frequency ratio $R_L$ within a predetermined range, the comparator circuit issues a selection control signal instructing the selection circuit 135 to select and output the sampling frequency ratio $R_s$ at the shorter period $t_s$.

The selection circuit 135 is responsive to the above-mentioned two selection control signal supplied from the comparator circuit 134 to output the sampling frequency ratio $R_L$ at the longer period $t_L$ or the sampling frequency ratio $R_s$ at the shorter period $t_s$ to an addition unit 136 of the controller 125.

Referring to FIG. 17, the controller 125 cumulatively adds the sampling frequency ratio $R_s$ or $R_L$ supplied from the sampling frequency ratio detection circuit 124, using the addition circuit 136 and the flip-flop circuit 139, for generating data readout addresses for the re-sampling buffer memory 113. On the other hand, the controller 125 generates, with the aid of the addition circuit 136 and the flip-flop circuit 139, the control signal for selecting the over-sampling factors to the interpolation circuit 114, and the leading and trailing linear interpolation factors (LIP.F.L. and LIP.F.T.).

The above data readout addresses, over-sampling factor selection control signal and the linear interpolation factors are output from the controller 125 as upper order bit range, mid order bit range and as lower order bit range, respectively.

The flip-flop circuit 137 is preferably a D-flip-flop. 8 $F_{so}$ clocks are supplied from an input terminal 138 keeping with the sampling frequency 8 $F_{so}$ of the output signals of the eighth embodiment. If the sampling frequency of the output signals is 4 or $2F_{so}$, 4 or $2F_{so}$ clocks are supplied, while an initializing signal $S_E$ is supplied at an input terminal 139.

Referring to FIG. 16, the interpolation circuit 114 comprises a leading FIR filter L for the leading linear interpolation factor (LIP. F.L.) 115 and a trailing FIR filter for the trailing linear interpolation factor (LIP. F.T.) 117 for over-sampling data read out by the address control signal generating circuit 125 from the re-sampling buffer memory 113 in accordance with the re-sampling time addresses as data readout addresses supplied from the controller 125, as well as for processing the data with linear interpolation. The interpolation circuit also has a factor ROM 116 for supplying the over-sampling factors to the leading FIR filter for the leading linear interpolation factor 115 and the trailing FIR filter for the trailing linear interpolation factor 117 and an addition circuit 118 for adding an output signal of the leading FIR filter for the leading linear interpolation factor 115 and an output signal of the trailing FIR filter for the trailing linear interpolation factor 117. The factor ROM 116 has, e.g., 32 quantity 24-bit, 7-word over-sampling factors.

Output data of the interpolation circuit 114 is 8 $F_{so}$ data. The 8 $F_{so}$ data is routed to a re-sampling frequency signal outputting circuit 119 which sub-samples the 8 $F_{so}$ data to produce 4 $F_{so}$ or 2 $F_{so}$ data. One of the 8 $F_{so}$, 4 $F_{so}$ or 2 $F_{so}$ data is selected by the multiplexor 119a.

The band-limiting filter 120 is a filter for preventing aliasing noise from being produced in output data. If the input sampling frequency $F_{si}$ is higher than the output sampling frequency $F_{so}$, there is a risk of the aliasing noise being produced, so that the output signal of the multiplexor 119a needs to be limited in bandwidth.

Consequently, the sampling frequency converting device of the present eighth embodiment adaptively changes over the high-speed re-sampling time address generation to the low-precision re-sampling time address generation or vice versa depending on the sampling frequency ratio, and performs the high accuracy sampling frequency conversion in case there is no substantial variation in the sampling frequency, while performing high-speed sampling frequency conversion in case there is any substantial variation in the sampling frequency, thus assuring compatibility between two inherently incompatible conversions of the high accuracy conversion and the high speed conversion.

Figure 18:
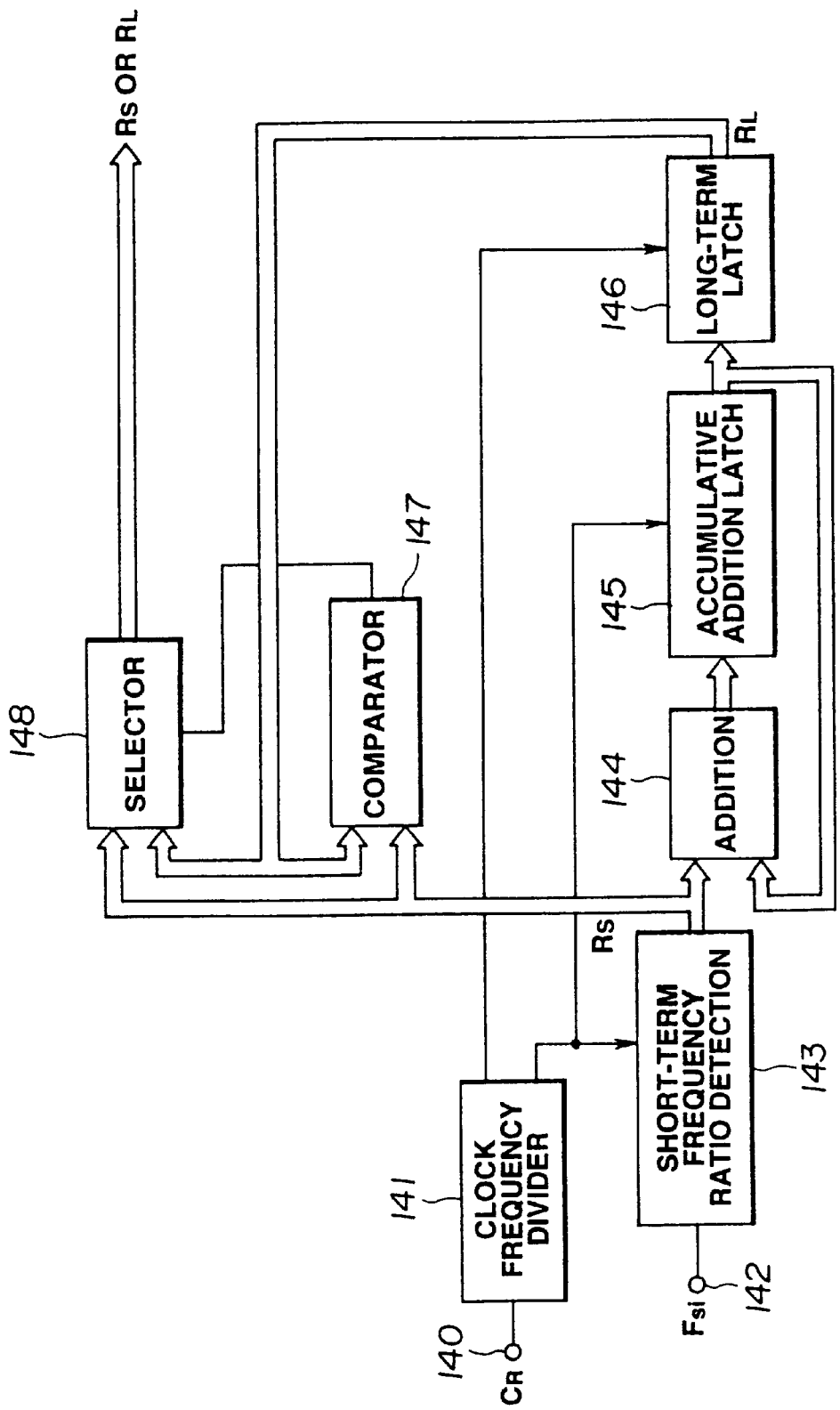
FIG. 18 is a schematic block diagram showing a sampling frequency ratio detection circuit employed in a sampling frequency converting device as a ninth embodiment of the present invention.

Referring to FIG. 18, a ninth embodiment will now be explained.

In the present ninth embodiment, the sampling frequency ratio $R_s$ of the short-term sampling frequency ratio detection circuit 143 having the short-term counter is cumulatively added by time-divisionally employing the addition circuit 144 for generation of the re-sampling time address generation of the controller for producing an adaptive sampling frequency ratio $R_n$, without independently providing the short-term counter 130 and the long term counter 132, as in the eighth embodiment, thus enabling omission of the long-term counter.

That is, with the present ninth embodiment, a comparator circuit 147 detects whether the sampling frequency ratio $R_s$ over the short period $t_s$ as determined by counting the sampling frequency $F_{si}$ of the input signal at the input terminal 142 by the clocks supplied from the clock frequency divider 141 is coincident with the sampling frequency ratio $R_L$ over the long period $t_L$ as found by cumulatively adding the sampling frequency $R_s$ using an addition circuit 144 and a cumulative addition latch 145 followed by counting using frequency-divided clocks by a long-term latch 146. In case of non-coincidence, the sampling frequency ratio $R_L$ over the long period $t_L$ is selected by the selection circuit 148, whereas, in case of coincidence, the sampling frequency ratio $R_s$ over the short period $t_s$ is selected by the selection circuit 148. The selected frequency ratio is output to a controller. It is noted that the clock frequency divider 141 divides the frequency of the reference clocks $C_R$ supplied from the input terminal 140 and clocks thus generated are routed to a short-term frequency ratio detection circuit 143, the cumulative addition latch circuit 145 and to the long-term latch circuit 146.

Thus the present ninth embodiment eliminates the long-term counter and is responsive to the sampling frequency ratio to be adaptively changed over between high-precision generation and high-speed generation of the re-sampling time addresses, in such a manner that high precision sampling frequency conversion and high speed sampling frequency conversion are performed in case there is not any significant variation in the sampling frequency and in case there is any significant variation in the sampling frequency, respectively.

Figure 19:
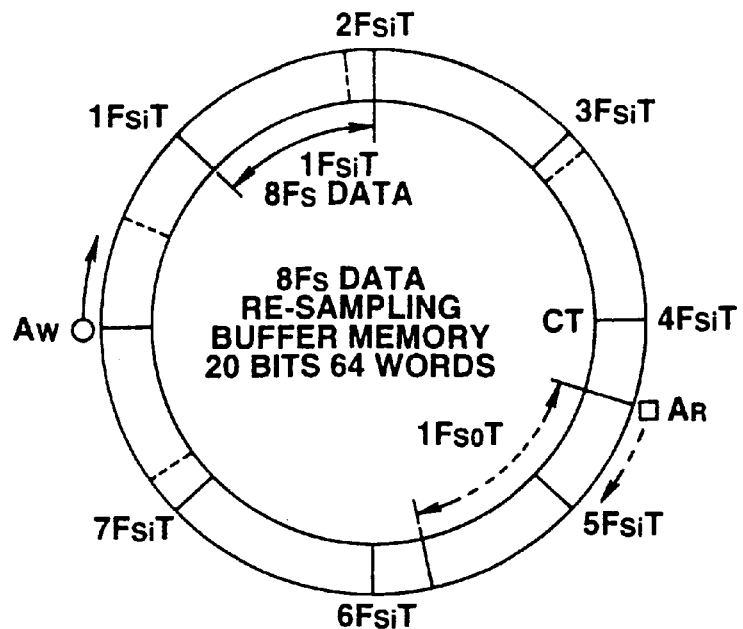
FIG. 19 schematically illustrates a re-sampling ring buffer memory applicable to a re-sampling buffer memory employed in the sampling frequency converting devices as the first to ninth embodiments.

Meanwhile, the ring-shaped buffer memories schematically shown in FIG. 19 may be employed as the re-sampling buffer memories 2, 13, 102 and 113 employed in the first to ninth embodiments.

That is, the re-sampling buffer memories 2, 13, 102 and 113 may be configured as a ring-shaped 8 $F_s$ 20-bit 64-word data re-sampling buffer memory as shown in FIG. 19. The manner of controlling the ring-shaped 8 $F_s$ data re-sampling buffer memory is explained subsequently.

In the first to ninth embodiments, data writing and readout on or from the ring-shaped 8 $F_s$ data re-sampling buffer memory is controlled by the memory control signal generating circuit 8 and 25 and the controllers 108 and 125. Thus the controllers 108 and 125 shown in FIGS. 14 and 16 supply data readout and data write addresses to the re-sampling buffer memories 102, 113 each designed as the 8 $F_s$ data re-sampling ring buffer memory, while also supplying data readout addresses to the re-sampling buffer memories 102, 113 from the sampling frequency ratio as detected by the sampling frequency ratio detection circuits 107, 124 for controlling the writing and readout of the re-sampling buffer memories 102, 113. Thus the controllers 108, 125 and the sampling frequency ratio detection circuits 107, 124 represent memory address controllers controlling the addresses of the re-sampling buffer memories 102, 113 and interpolation circuits controlling the interpolation circuits 103, 114.

Figure 20:
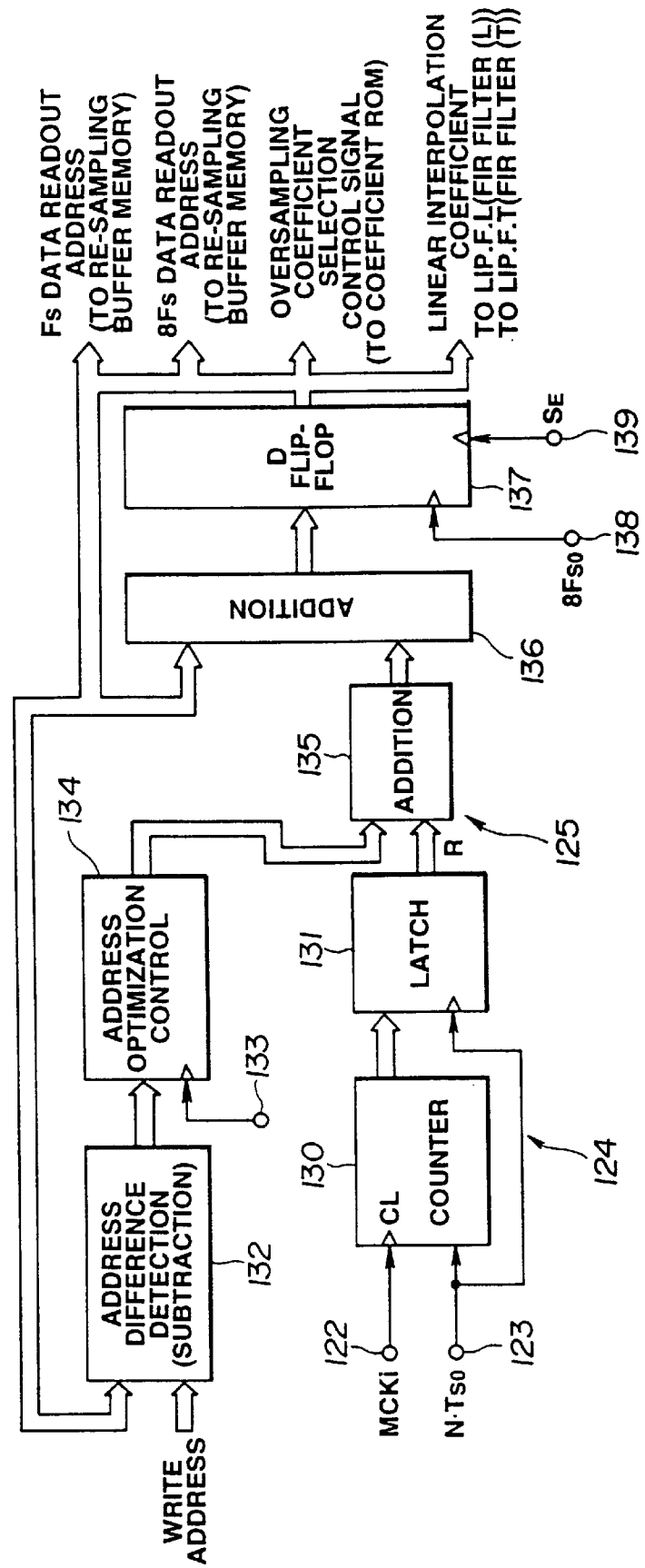
FIG. 20 is a schematic block diagram showing a memory address controller controlling the addresses of the ring buffer memory.

Referring to FIG. 20, the memory address controlling device made up of a sampling frequency ratio detection circuit 124 and the controller 125 will be explained.

The memory address controlling device controls the readout addresses of the re-sampling buffer memory 113, which is a ring buffer memory for continuously recording and reproducing data on or from the recording medium, with the difference of the readout addresses being arbitrarily changed with respect to the write addresses. The main address controlling device comprises a controller 125 made up of an address difference detection circuit 132 for detecting the difference between the write address and the readout address and an address optimizing control circuit 134 for effecting optimal control on the readout address for controlling the address difference as detected by the address difference detection circuit 132, and a sampling frequency ratio detection circuit 124.

The sampling frequency ratio detection circuit 124 has a counter 130 for counting the multiple-number sampling period $N \cdot T_{so}$ at the time period t entering the input terminal 123 by the input master clocks $MCK_i$ supplied from the input terminal 122, and a latch 131 for latching the count output of the counter 130 based on the multiple-number sampling period $N \cdot T_{so}$.

The counter 130 counts the multiple-number sampling period $N \cdot T_{so}$ by the input master clocks $MCK_i$ and latches the result of count by the latch 131 to find the current sampling frequency ratio R at the period t.

The controller 125 includes, in addition to the address difference detection circuit 132 and the address optimization controlling circuit 134, an addition circuit 135 for adding output signals of the address optimization control circuit 134 to the sampling frequency ratio R from the latch 131 responsive to the address difference as detected by the address difference detection circuit 132, an addition circuit 136 for cumulatively adding the addition outputs of the addition circuit 135 and a flip-flop circuit 137.

The flip-flop circuit 137 is preferably a D-flip-flop. 8 $F_{so}$ clocks are supplied from an input terminal 138 in keeping with the sampling frequency 8 $F_{so}$ of the output signals of the second embodiment. If the sampling frequency of the output signals is 4 or $2F_{so}$, 4 or $2F_{so}$ clocks are supplied, while an initializing signal $S_E$ is supplied at an input terminal 139.

Figure 21:
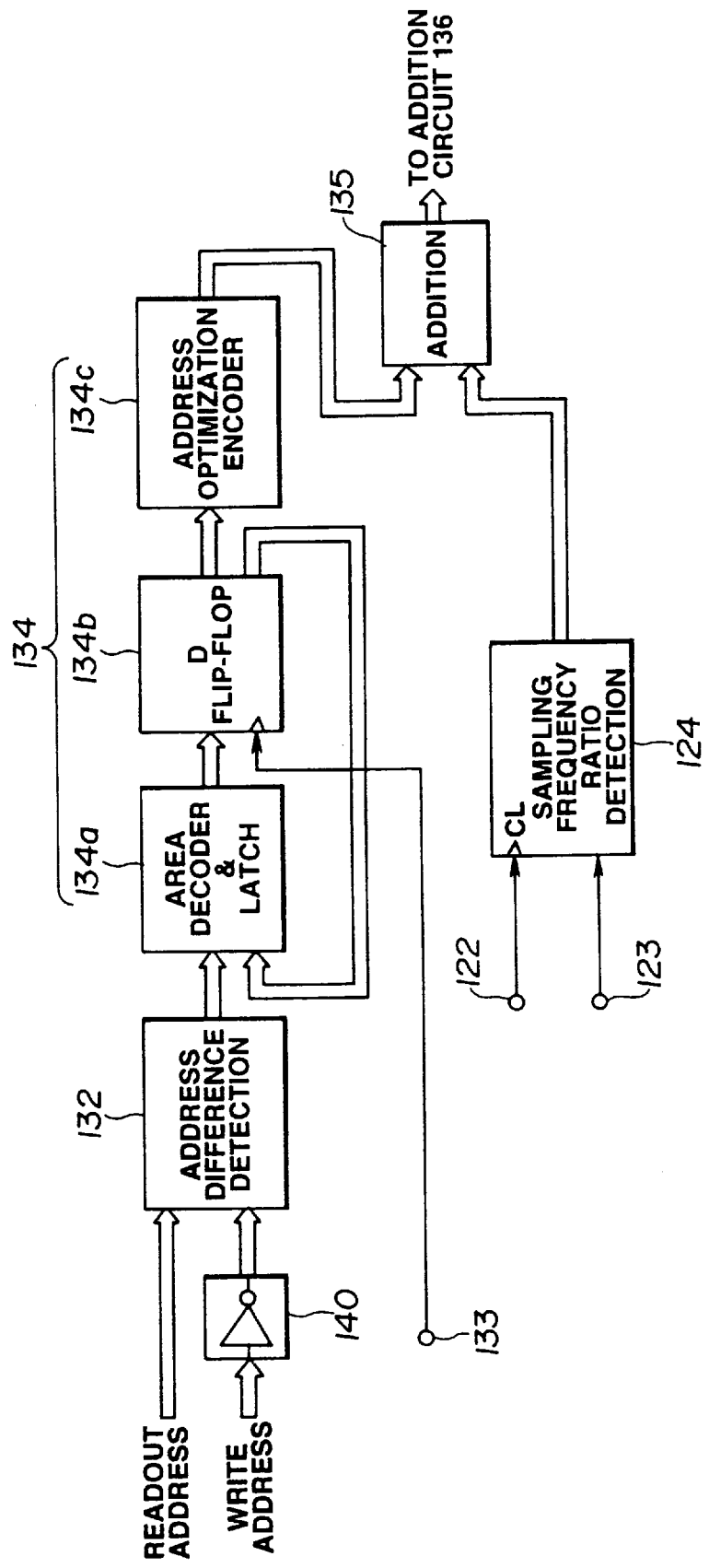
FIG. 21 is a schematic block diagram showing an address optimization control circuit of the memory address controller.

The address difference detection circuit 132 adds the write address from an inverter 140 shown in FIG. 21 to the readout address to find the difference between the readout address and the write address. Such difference between the readout address and the write address represents a measure indicating the allowance of the re-sampling buffer memory 113. If the address difference is depleted, an overflow state is produced in the re-sampling buffer memory 113.

The address difference optimization control circuit 134 is a control circuit for optimizing the readout address so that the address difference as detected by the address difference detection circuit 132 is controlled to an optimum value, and comprises an area decoder and latch 134a, a D-flip-flop 134b and an address optimizing encoder 134c, as shown in FIG. 21.

The address difference optimization control circuit 134 decodes the address difference as detected by the address difference detection circuit 132 and causes the area decoder and latch 134a and the D-flip-flop 134b to latch and monitor at a certain period which area the detected address difference occupies with respect to an absolute maximum point of the write/readout address difference CT. The address difference optimization control circuit 134 is responsive to the monitored result to generate in the address optimizing encoder 134c a correction value to be added by the addition circuit 135 to the sampling frequency ratio R as detected by the sampling frequency ratio detection circuit 124.

If, for example, the re-sampling buffer memory 13 is a ring 8 $F_s$ data re-sampling buffer memory having the capacity of 20 bits and 64 words, as shown in FIG. 19, the memory address controlling device controls the readout address $A_R$ so that the data write address $A_W$ and the data readout address $A_R$ are in operation with a phase difference of 180° with the word difference of 32. Meanwhile, the memory address control device has eight $F_{si}T$ data domain address with a point of $4F_{si}T$ being CT.

Figure 22:
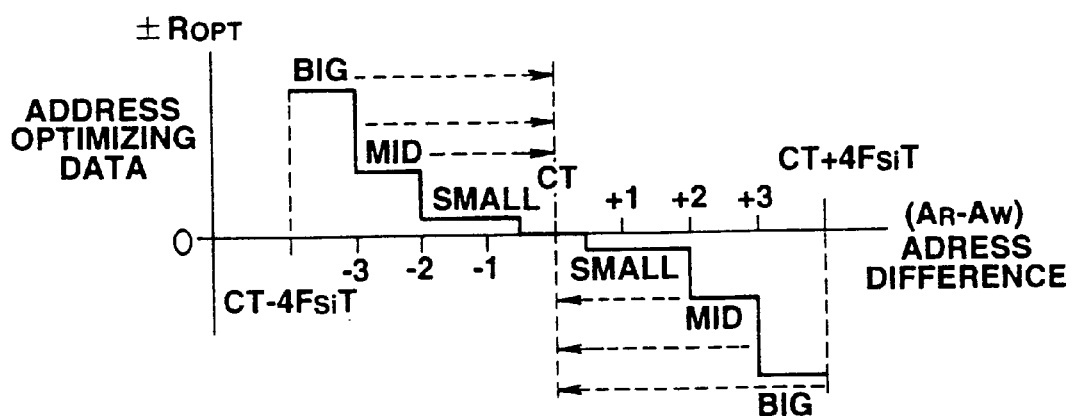
FIG. 22 illustrates the operation of the memory address controller.

If the address difference detected by the address difference detection circuit 132 is, in a range of from $CT-0.5 F_{si}T$ to $CT+0.5 F_{si}T$, that is in a range of from 180±0.5 Tsi (±8 $F_{si}$ samples), on the abscissa of FIG. 22, the address optimization control circuit 134 of the memory address control device outputs a 0 output correction value to the addition circuit 135. Thus the memory address control device cumulatively adds only the sampling frequency ratio R as detected by the sampling frequency ratio detection circuit 124 by the addition circuit 136 and the D-flip-flop circuit 137 to generate the memory readout addresses. If the address difference detected by the address difference detection circuit 132 is not in the range of from $CT-0.5 F_{si}T$ to $CT+0.5 F_{si}T$, that is, in the range of from 180±0.5 $T_{si}$ (±8 $F_{si}$ samples), the address optimization control circuit 134 adds the correction value from the address optimization encoder 134c to the sampling frequency ratio R, until the absolute value of the address difference becomes equal to the maximum value CT (=180°), by incrementing or decrementing the readout address. In addition, the circuit 132 cumulatively adds the correction value by the addition circuit 136 and the D-flip-flop circuit 137 to generate the memory readout addresses.

Specifically, if the address difference as detected by the address difference detection circuit 132 is in a range of from CT–0.5 FsiT to CT–2 FsiT, as plotted on the abscissa of FIG. 21, the address optimization control circuit 134 adds a correction value to the sampling frequency ratio R at the addition circuit 135. The correction value is set so as to be twice the LSB of an imaginary set readout address or a virtual readout address. If the address difference is from CT–2 FsiT to CT–3 FsiT, the circuit 134 adds a correction value optimized from 256 times the LSB of the virtual address to the sampling frequency ratio R. If the address difference is from CT–3 FsiT to CT–4 FsiT, the circuit 134 adds a correction value optimized from 32768 times the LSB of the virtual address to the sampling frequency ratio R.

On the other hand, if the address difference as detected by the address difference detection circuit 132 is in a range of from CT+0.5 FsiT to CT+2 FsiT, the address optimization control circuit 134 adds (or effectively subtracts) an inverted correction value optimized from twice the LSB of the virtual address to the sampling frequency ratio R in the addition circuit 135. If the address difference is in a range of from CT+2 FsiT to CT+3 FsiT, the address optimization control circuit 134 adds (or effectively subtracts) an inverted correction value optimized from 256 times the LSB of the virtual address to the sampling frequency ratio R in the addition circuit 135. On the other hand, if the address difference is in a range of from CT+3 FsiT to CT+4 FsiT, the address optimization control circuit 134 adds (or effectively subtracts) an inverted correction value optimized from 32768 times the LSB of the virtual address to the sampling frequency ratio R in the addition circuit 135.

That is, the address optimization control circuit 134 corrects the readout addresses until the phase difference becomes equal to 180° by adding or subtracting 1 at the second bit from the LSB of the virtual readout address when the address difference as detected by the address difference detection circuit 132, that is, the readout phase, is deviated to ±2 180° Tsi from 180±0.5 Tsi, by adding or subtracting 1 at the eighth bit of the virtual address when the readout phase is deviated to 180 ±3 Tsi from 180±2 Tsi and by adding or subtracting 1 at the 15th bit when the readout phase is deviated by 180±3 Tsi or more.

Thus the memory address control device sets an optimum phase at a high speed by employing a large correction value when the readout address phase is advanced or retarded significantly during power on time or during switching of the input signals or the output sampling frequency, while setting an optimum phase without signal deterioration by employing a medium correction value when the address phase is advanced or retarded to a moderate extent during change of the sampling frequency. On the other hand, if the address phase is advanced or retarded only slightly, the memory address control device sets an optimum phase without signal deterioration by employing a small correction value. That is, the high-speed correction and high-precision conversion can be used with compatibility by exploiting an optimum correction value depending on the state of signal deviation.

What is claimed is:

1. A device for converting a sampling frequency of an input signal into a desired arbitrary sampling frequency of an output signal, comprising:

storage means for storing the input signal in order to re-sample the sampling frequency of the input signal;

interpolation means for interpolating a stored input signal read out from said storage means;

address difference detection means for detecting a difference between a read address and a write address of said storage means; and memory address control means for calibrating the read address of said storage means to maintain the phase between the read address and the write address of said storage means within a predetermined range in accordance with the difference detected by said address difference detection means when a phase fluctuation occurs due to excessive fluctuation of the sampling frequency.

2. The device as claimed in claim 1, wherein said memory address control means includes address optimization control means for optimally controlling the difference detected by said address difference detection means.

3. The device as claimed in claim 2, wherein said address optimization control means included in said memory address control means generates read addresses for said storage means based on an absolute value of the difference detected by said address difference detection means.

4. A memory address control device for a ring buffer memory comprising:

address difference detection means for detecting the difference between a write address and a read address of the ring buffer memory; and read address control means for calibrating the read address of the ring buffer memory to maintain the phase between the read address and the write address of the ring buffer memory within a predetermined range in accordance with the difference detected by said address difference detection means when a phase fluctuation occurs due to excessive fluctuation of the sampling frequency.

5. The memory address control device as claimed in claim 4, wherein said read address control means generates the read address for said storage means based on an absolute value of the difference detected by said address difference detection means.

* * * * *